United States Patent
Aoki et al.

(10) Patent No.: US 12,006,433 B2
(45) Date of Patent: Jun. 11, 2024

(54) THERMOSETTING RESIN COMPOSITION, RESIN SHEET, LAMINATE, AND PRINTED WIRING BOARD

(71) Applicant: Panasonic Intellectual Property Management Co., Ltd., Osaka (JP)

(72) Inventors: Kouichi Aoki, Hyogo (JP); Tomoyuki Aoki, Osaka (JP); Eiichiro Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 288 days.

(21) Appl. No.: 17/426,917

(22) PCT Filed: Jan. 30, 2020

(86) PCT No.: PCT/JP2020/003367
§ 371 (c)(1),
(2) Date: Jul. 29, 2021

(87) PCT Pub. No.: WO2020/158849
PCT Pub. Date: Aug. 6, 2020

(65) Prior Publication Data
US 2022/0098404 A1     Mar. 31, 2022

(30) Foreign Application Priority Data

Jan. 31, 2019 (JP) .................. 2019-016437

(51) Int. Cl.
*C08L 71/12* (2006.01)
*C08F 255/06* (2006.01)
*C08F 283/08* (2006.01)
*H05K 3/02* (2006.01)
*H05K 3/46* (2006.01)

(52) U.S. Cl.
CPC .......... *C08L 71/126* (2013.01); *C08F 255/06* (2013.01); *C08F 283/08* (2013.01); *C08L 2201/02* (2013.01); *C08L 2205/035* (2013.01); *H05K 3/022* (2013.01); *H05K 3/4611* (2013.01); *H05K 3/4673* (2013.01); *H05K 2201/0195* (2013.01)

(58) Field of Classification Search
CPC .... C08F 283/08; C08F 255/06; C08L 71/126; C08L 2201/02; C08L 2205/035; H05K 3/022; H05K 3/4611; H05K 3/4673; H05K 2201/0195
See application file for complete search history.

(56) References Cited

U.S. PATENT DOCUMENTS

| | | | |
|---|---|---|---|
| 4,612,348 A * | 9/1986 | Sun .................. | C08L 51/04 |
| | | | 525/193 |
| 2007/0059638 A1 | 3/2007 | Namba et al. | |
| 2010/0307803 A1* | 12/2010 | Paul .................. | B32B 5/30 |
| | | | 524/505 |
| 2014/0187714 A1 | 7/2014 | Horiguchi et al. | |
| 2016/0159689 A1 | 6/2016 | Burgel et al. | |
| 2016/0177148 A1 | 6/2016 | Horiguchi et al. | |
| 2017/0226302 A1 | 8/2017 | Saito et al. | |
| 2018/0009926 A1 | 1/2018 | Kuroki et al. | |
| 2018/0163023 A1* | 6/2018 | Liao .................. | C08K 3/36 |
| 2018/0197764 A1* | 7/2018 | Kamada ............. | B32B 15/095 |
| 2018/0258324 A1 | 9/2018 | Tochihira et al. | |
| 2018/0263115 A1* | 9/2018 | Su .................... | C08J 5/249 |
| 2020/0010675 A1* | 1/2020 | Yamatsu ............ | H01L 24/92 |
| 2021/0079215 A1 | 3/2021 | Arisawa et al. | |

FOREIGN PATENT DOCUMENTS

| | | | |
|---|---|---|---|
| EP | 0150021 | * | 7/1985 |
| JP | 2003-064132 A | | 3/2003 |
| JP | 2007-079153 A | | 3/2007 |
| JP | 2013-159692 A | | 8/2013 |
| JP | 2016-056367 A | | 4/2016 |
| JP | 2016-525172 A | | 8/2016 |
| JP | 2018-028078 | * | 2/2018 |
| JP | 2018-28078 A | † | 2/2018 |
| JP | 2018-168347 A | | 11/2018 |
| WO | 2013/035871 A1 | | 3/2013 |
| WO | WO 2016/117554 A1 | | 7/2016 |
| WO | WO 2016/171151 A1 | | 10/2016 |
| WO | WO 2018/030112 A1 | | 2/2018 |
| WO | WO 2019/012954 A1 | | 1/2019 |

OTHER PUBLICATIONS

ISR for PCT/JP2020/003367, dated Apr. 7, 2020 (w/ translation).
Office Action issued in Japanese patent Application No. 2020-569714, Nov. 28, 2023, translation.

* cited by examiner
† cited by third party

*Primary Examiner* — Patrick D Niland
(74) *Attorney, Agent, or Firm* — GREENBLUM & BERNSTEIN, P.L.C.

(57) ABSTRACT

The thermosetting resin composition contains a radical polymerizable unsaturated compound and an organic radical compound.

11 Claims, 3 Drawing Sheets

THERMOSETTING RESIN COMPOSITION, RESIN SHEET, LAMINATE, AND PRINTED WIRING BOARD

TECHNICAL FIELD

The present disclosure generally relates to a thermosetting resin composition, a resin sheet, a laminate, and a printed wiring board. More particularly, the present disclosure relates to a thermosetting resin composition containing a radical polymerizable unsaturated compound, a resin sheet made of the thermosetting resin composition, a laminate including an insulating layer made of the thermosetting resin composition, and a printed wiring board including an insulating layer made of the thermosetting resin composition.

BACKGROUND ART

Patent Literature 1 discloses a thermosetting adhesive composition for use to form a thermosetting adhesive film to manufacture a printed wiring board. The thermosetting adhesive composition contains, at a predetermined ratio: a vinyl compound having a polyphenylene ether skeleton; a maleimide resin; and a thermoplastic elastomer which includes a component polyolefin skeleton as a main component and which is a copolymer of a polyolefin block and a polystyrene block. The thermosetting adhesive composition has a tensile stress of 0.1-2.9 MPa at an elongation of 100% and has an elongation of 100% or more when the thermosetting adhesive composition is cut off.

CITATION LIST

Patent Literature

Patent Literature 1: WO 2016/117554 A1

SUMMARY OF INVENTION

An object of the present disclosure is to provide a thermosetting resin composition which exhibits, when the thermosetting resin composition and a semi-cured product thereof are heated, the property of maintaining a low melt viscosity state first and then turning curable quickly, which improves the preservation stability of the thermosetting resin composition and a semi-cured product thereof, and which reduces an increase in the coefficient of linear expansion and curbs a decrease in the glass transition temperature of the cured product as is often involved with heating. Another object of the present disclosure is to provide a resin sheet made of such a thermosetting resin composition. Still another object of the present disclosure is to provide a laminate including an insulating layer made of the thermosetting resin composition. Yet another object of the present disclosure is to provide a printed wiring board including an insulating layer made of the thermosetting resin composition.

A thermosetting resin composition according to an aspect of the present disclosure contains: a radical polymerizable unsaturated compound; and an organic radical compound.

A resin sheet according to another aspect of the present disclosure includes a dried product or semi-cured product of the thermosetting resin composition described above.

A laminate according to still another aspect of the present disclosure includes an insulating layer and a sheet of metal foil. The insulating layer contains a cured product of the thermosetting resin composition described above.

A printed wiring board according to yet another aspect of the present disclosure includes an insulating layer and conductor wiring. The insulating layer contains a cured product of the thermosetting resin composition described above.

DESCRIPTION OF EMBODIMENTS

Figure 1A:
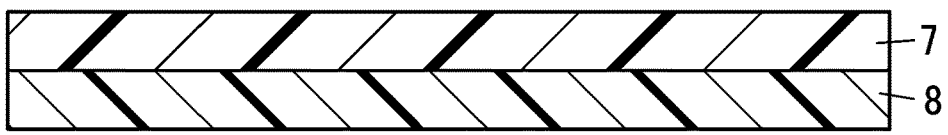
FIG. 1A is a cross-sectional view schematically illustrating a resin sheet according to an exemplary embodiment of the present disclosure.

First of all, it will be outlined how the present inventors acquired the basic idea of the present disclosure.

In a thermosetting resin composition containing a radical polymerizable compound such as a vinyl compound having a polyphenylene skeleton as disclosed in Patent Literature 1, if a dried product or semi-cured product of such a thermosetting resin composition is heated, the thermosetting resin composition will be cured quickly before its viscosity becomes sufficiently low. Thus, if an insulating layer is formed of such a thermosetting resin composition or a dried product or semi-cured product thereof, for example, to overlap with conductor wiring, then it may be difficult to fill the gap between respective parts of the conductor wiring with the insulating layer sufficiently. In addition, a curing reaction may advance during the preservation of the thermosetting resin composition or a dried product or semi-cured product thereof.

However, if a general polymerization inhibitor such as a phenolic compound is used to reduce the polymerization reaction of the thermosetting resin composition or a dried product or a semi-cured product thereof, then the coefficient of linear expansion of the cured product tends to rise and the glass transition temperature thereof tends to fall, thus often causing deterioration in the thermal properties of the cured product.

Thus, the present inventors carried out extensive research and development to easily maintain a low-viscosity state when the thermosetting resin composition or a dried or semi-cured product thereof is heated, improve their preservation stability, and reduce an increase in the coefficient of linear expansion of the cured product and curb a decrease in the glass transition temperature thereof as is often observed when the thermosetting resin composition or a dried or semi-cured product is heated, thus acquiring the basic idea of the present disclosure.

An exemplary embodiment of the present disclosure will now be described.

A thermosetting resin composition according to an exemplary embodiment (hereinafter simply referred to as a "composition (X)") contains a radical polymerizable unsaturated compound and an organic radical compound. This facilitates the composition (X), a dried product of the composition (X), and a semi-cured product of the composition (X) maintaining a low-viscosity state when heated. In addition, this also facilitates improving the preservation stability of the composition (X), a dried product of the composition (X), and a semi-cured product of the composition (X). Furthermore, this also reduces the chances of causing an increase in the coefficient of linear expansion of the cured product or a decrease in the glass transition temperature thereof as is often observed when the composition (X), a dried product of the composition (X), or a semi-cured product of the composition (X) is heated. Furthermore, this improves the flame retardancy of the cured product of the composition (X) as well.

The mechanism that contributes to achieving these advantages of this embodiment is presumed by the present inventors to be follows:

When a radical active species is produced from a radical polymerizable unsaturated compound, a radical polymerization reaction advances in chain, thus causing the radical polymerizable unsaturated compound to be polymerized. A general polymerization inhibitor such as a phenolic compound reacts to the radical active species to bring the radical polymerization reaction to a halt, thus allowing the composition (X), a dried product thereof, and a semi-cured product thereof to maintain a low-viscosity state easily even under the heat and improving the preservation stability of the composition (X), a dried product thereof, and a semi-cured product thereof. Nevertheless, the product of reaction between a radical active species and a phenolic compound has so high a degree of stability that the reaction product significantly inhibits the polymerization reaction of the radical polymerizable unsaturated compound. Therefore, the polymerization inhibitor often causes a decrease in the crosslink density in the cured product, which often tends to cause an increase in the coefficient of linear expansion of the cured product and a decrease in the glass transition temperature thereof.

In contrast, according to this embodiment, when a radical active species is produced in the composition (X), a dried product thereof, or a semi-cured product thereof, the radical active species and an organic radical compound react to each other, thus producing a stabilized reaction product. Thus, the composition (X), a dried product thereof, and a semi-cured product thereof may maintain a low-viscosity state easily even when heated. In addition, this also improves the preservation stability of the composition (X), a dried product thereof, and a semi-cured product thereof. Furthermore, when the product of reaction between the radical active species and the organic radical compound is further heated, the reaction product will be decomposed to often produce a radical active species again. As can be seen, when a radical active species is produced, the curing reaction tends to advance steeply. Therefore, the present inventor presume that this should facilitate increasing the crosslink density of the cured product, which would reduce the chances of causing an increase in the coefficient of linear expansion of the cured product and a decrease in the glass transition temperature thereof and would improve the flame retardancy of the cured product.

Next, components that the composition (X) may contain will be described.

As the compound (A) having a radical polymerizable unsaturated bond (hereinafter simply referred to as a "compound (A)"), any compound may be used without limitation as long as the compound is polymerizable through thermal radical polymerization reaction. The compound (A) may have, for example, an ethylenic unsaturated bond, and more specifically, includes at least one group selected from the group consisting of a vinyl group, an allyl group, a methacrylic group, a styryl group, a meth(acrylic) group, and a maleimide group. Selecting a component included in the compound (A) allows the physical properties of the composition (X), a semi-cured product thereof, and a cured product thereof to be controlled. For example, if the compound (A) contains a monofunctional compound having a single polymerizable unsaturated group, then the monofunctional compound may reduce the melt viscosity of the composition (X) and improve the moldability thereof. On the other hand, if the compound (A) contains a multifunctional compound having a plurality of polymerizable unsaturated groups, then the multifunctional compound may increase the crosslink density of the cured product. Thus, the multifunctional compound contributes to increasing the tenacity of the cured product, the glass transition temperature thereof, and heat resistance thereof and decreasing the coefficient of linear expansion as well.

The components that the compound (A) may include will be described more specifically.

The compound (A) suitably contains a copolymer (A1) having a structural unit derived from mono-olefin (hereinafter referred to as a "mono-olefin unit") and a structural unit derived from diene (hereinafter referred to as a "diene unit"). Such a copolymer (A1) will be hereinafter referred to as a "copolymer (A1)."

The copolymer (A1) generally has film forming ability, and therefore, tends to improve the moldability when a resin film is formed by molding the composition (X) into a sheet shape, tends to reduce the dielectric constant of the cured product because the copolymer (A1) has a low dielectric constant, tends to decrease the coefficient of linear expansion of the cured product because the diene unit is a polymerizable unsaturated group, and further tends to increase the heat resistance of the cured product.

The mono-olefin unit of the copolymer (A1) may include either only one type of structural unit or two or more types of structural units. The mono-olefin unit suitably includes one or more structural units selected from the group consisting of: a structural unit derived from ethylene (hereinafter referred to as an "ethylene unit"); a structural unit derived from propylene (hereinafter referred to as a "propylene unit"); a structural unit derived from butylene (hereinafter referred to as a "butylene unit"); a structural unit derived from α-olefin (hereinafter referred to as an "α-olefin unit"); a structural unit derived from hydrogenated butadiene (hereinafter referred to as a "hydrogenated butadiene unit"); and a structural unit derived from hydrogenated isoprene (hereinafter referred to as a "hydrogenated isoprene unit"). Note that the structural units included in the mono-olefin unit are not limited to this group. For example, the mono-olefin unit may include an ethylene unit and a propylene unit. That is to say, the copolymer (A1) may include an ethylene-propylene-diene copolymer. The ethylene-propylene-diene copolymer is generally also called "EPDM (ethylene-propylene-diene terpolymer) rubber."

The diene unit may include one or more structural units selected from the group consisting of: a structural unit derived from 5-ethylidene-2-norbornene (hereinafter referred to as a "5-ethylidene-2-norbornene unit"); a structural unit derived from dicyclopentadiene (hereinafter referred to as a "dicyclopentadiene unit"); a structural unit derived from 1,4-hexadiene (hereinafter referred to as a "1,4-hexadiene unit"), a structural unit derived from butadiene (hereinafter referred to as a "butadiene unit"); and a structural unit derived from isoprene (hereinafter referred to as an "isoprene unit"). The structural units included in the diene unit are not limited to this group. The diene unit suitably includes a 5-ethylidene-2-norbornene unit.

The copolymer (A1) suitably includes an ethylene unit, a propylene unit, and a 5-ethylidene-2-norbornene unit. That is to say, the molecule in the copolymer (A1), for example, suitably has the structure expressed by the following Formula (1), in which n, m, and 1 are natural numbers, each indicating the number of structural units in Formula (1). Therefore, Formula (1) is a composition formula representing the ratio of the structural units. Specifically, Formula (1) indicates that the copolymer (A1) includes n moles of the ethylene unit, m moles of the propylene unit, and 1 moles of the diene unit. The 5-ethylidene-2-norbornene unit that is the diene unit contributes to accelerating the curing reaction of the composition (X), thus shortening the time it takes to have the composition (X) cured.

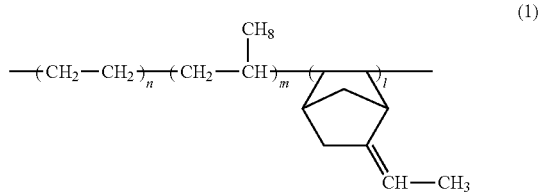

(1)

The mass ratio of the diene unit with respect to the entire copolymer (A1) is suitably equal to or greater than 3%. This contributes to increasing the heat resistance of the cured product. The ratio of the diene unit more suitably falls within the range from 3% to 15%.

The mass ratio of the ethylene unit with respect to the entire copolymer (A1) is suitably equal to or greater than 50%. This facilitates forming the composition (X) into a sheet shape. The ratio of the ethylene unit more suitably falls within the range from 50% to 85%.

The Mooney viscosity ML (1+4) 100° C. of the copolymer (A1) as defined by JIS K6300-1:2013 is suitably 10 or more. This also allows the composition (X) to be easily formed into a sheet shape, and the molded product obtained by forming the composition into the sheet shape to have reduced tackiness. The Mooney viscosity ML (1+4) 125° C. of the copolymer (A1) as defined by JIS K6300-1:2013 is more suitably equal to or less than 80. Setting the Mooney viscosity at 80 or less may prevent the melt viscosity of the copolymer (A1) from becoming too high and may improve the moldability of the cured product.

Note that the Mooney viscosity of the copolymer (A1) increases as the molecular weight of the copolymer (A1) increases. Therefore, the Mooney viscosity may be adjusted by at least one means selected from the group consisting of, for example: adjusting the molecular weight of the molecules contained in the copolymer (A1); adding molecules having different molecular weights to the copolymer (A1) and adjusting the mixing ratio thereof; and adjusting the molecules contained in the copolymer (A1) into a branched structure.

Also, the compound (A) suitably contains a terminal-modified polyphenylene ether compound (A2) (hereinafter, also referred to as a "compound (A2)"). In this case, since the compound (A2) generally has excellent dielectric properties, the cured product may have its dielectric constant and dielectric loss tangent decreased. In addition, since the compound (A2) is a material exhibiting flame retardancy, excellent flame retardancy is easily achievable.

The compound (A2) is polyphenylene ether which is terminal-modified with a substituent having a carbon-carbon unsaturated double bond. That is to say, the compound (A2) has, for example, a polyphenylene ether chain and a substituent having a carbon-carbon unsaturated double bond bonded to the terminal of the polyphenylene ether chain.

The substituent having a carbon-carbon unsaturated double bond may be, for example, the substituent expressed by the following Formula (2):

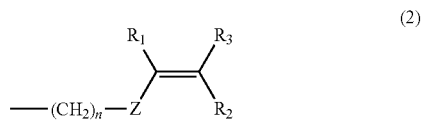

(2)

where n is a number falling within the range from 0 to 10, Z is an arylene group, and $R_1$ to $R_3$ each independently represent a hydrogen atom or an alkyl group. In Formula (2), if n is zero, then Z is directly bonded to a terminal of a polyphenylene ether chain.

The arylene group may be, for example, a monocyclic aromatic group such as a phenylene group or a polycyclic aromatic group such as a naphthylene group. At least one hydrogen atom bonded to the aromatic ring of the arylene group may be replaced with a functional group such as an alkenyl group, an alkynyl group, a formyl group, an alkylcarbonyl group, an alkenylcarbonyl group, or an alkynylcarbonyl group. The arylene group is not limited to this group.

The alkyl group is suitably an alkyl group having 1 to 18 carbon atoms, and more suitably an alkyl group having 1 to 10 carbon atoms. Specifically, the alkyl group may be, for example, a methyl group, an ethyl group, a propyl group, a hexyl group, or a decyl group. The alkyl group is not limited to these.

The substituent having a carbon-carbon unsaturated double bond may have, for example: a vinylbenzyl group (ethenylbenzyl group) such as a p-ethenylbenzyl group or an m-ethenylbenzyl group; a vinylphenyl group; an acrylate group; or a methacrylate group. The substituent having a carbon-carbon unsaturated double bond suitably has a vinylbenzyl group, a vinylphenyl group, or a methacrylate group, among other things. When the substituent having a carbon-carbon unsaturated double bond has an allyl group, the reactivity of the compound (A2) tends to be low. Further, if the substituent having a carbon-carbon unsaturated double bond has an acrylate group, the reactivity of the compound (A2) tends to be too high.

A suitable specific example of the substituent having a carbon-carbon unsaturated double bond may be a functional group including a vinylbenzyl group. Specifically, the substituent having a carbon-carbon unsaturated double bond may be, for example, a substituent expressed by the following Formula (3) or Formula (4):

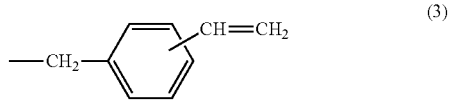

(3)

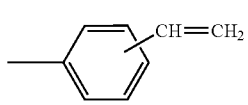

The substituent having a carbon-carbon unsaturated double bond may also be a (meth)acrylate group. The (meth)acrylate group is expressed by, for example, the following Formula (5):

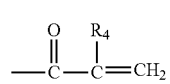

In Formula (5), $R_4$ is a hydrogen atom or an alkyl group. The alkyl group is suitably an alkyl group having 1 to 18 carbon atoms, and more suitably an alkyl group having 1 to 10 carbon atoms. Specifically, for example, the alkyl group is a methyl group, an ethyl group, a propyl group, a hexyl group, or a decyl group. The alkyl group is not limited to these.

The compound (A2) has a polyphenylene ether chain in the molecule as described above. The polyphenylene ether chain has, for example, a repeating unit expressed by the following Formula (6):

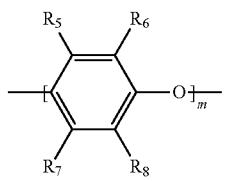

In Formula (6), m is a number falling within the range from 1-50. $R_5$ to $R_8$ each independently represent a hydrogen atom, an alkyl group, an alkenyl group, an alkynyl group, a formyl group, an alkylcarbonyl group, an alkenylcarbonyl group, or an alkynylcarbonyl group. Each of $R_5$ to $R_8$ is suitably a hydrogen atom or an alkyl group. The alkyl group is suitably, for example, an alkyl group having 1 to 18 carbon atoms, and more suitably an alkyl group having 1 to 10 carbon atoms. Specifically, the alkyl group may be, for example, a methyl group, an ethyl group, a propyl group, a hexyl group, or a decyl group. The alkenyl group is suitably an alkenyl group having 2 to 18 carbon atoms, and more suitably an alkenyl group having 2 to 10 carbon atoms. Specifically, the alkenyl group may be, for example, a vinyl group, an allyl group, or a 3-butenyl group. The alkynyl group is suitably an alkynyl group having 2 to 18 carbon atoms, and more suitably an alkynyl group having 2 to 10 carbon atoms. Specifically, the alkynyl group is, for example, an ethynyl group, a prop-2-yn-1-yl group (propargyl group). The alkylcarbonyl group may be a carbonyl group replaced with an alkyl group. For example, an alkylcarbonyl group having 2 to 18 carbon atoms is suitable, and an alkylcarbonyl group having 2 to 10 carbon atoms is more suitable. Specifically, the alkylcarbonyl group may be, for example, an acetyl group, a propionyl group, a butyryl group, an isobutyryl group, a pivaloyl group, a hexanoyl group, an octanoyl group, or a cyclohexylcarbonyl group. The alkenylcarbonyl group may be a carbonyl group replaced with an alkenyl group, for example, and is suitably an alkenylcarbonyl group having 3 to 18 carbon atoms, and more suitably an alkenylcarbonyl group having 3 to 10 carbon atoms. Specifically, the alkenylcarbonyl group may be, for example, an acryloyl group, a methacryloyl group, or a crotonoyl group. The alkynylcarbonyl group may be a carbonyl group replaced with an alkynyl group, for example, and is suitably an alkynylcarbonyl group having 3 to 18 carbon atoms, and more suitably an alkynylcarbonyl group having 3 to 10 carbon atoms. Specifically, the alkynylcarbonyl group may be, for example, a propioloyl group. The alkyl group, alkenyl group, alkynyl group, formyl group, alkylcarbonyl group, alkenylcarbonyl group and alkynylcarbonyl group are not limited to these.

The weight mean molecular weight (Mw) of the compound (A2) suitably falls within the range from 500 to 5000, more suitably falls within the range from 500 to 2000, and even more suitably falls within the range from 1000 to 2000. The weight mean molecular weight is a value obtained by converting the result of measurement obtained by gel permeation chromatography (GPC) into an equivalent polystyrene weight. If the compound (A2) has a repeating unit expressed by Formula (6) in the molecule, m in Formula (6) is suitably a value that makes the weight mean molecular weight of the compound (A2) fall within any of the suitable ranges described above. Specifically, m suitably falls within the range from 1 to 50. If the weight mean molecular weight of the compound (A2) falls within such a range, the compound (A2) imparts excellent dielectric properties to the cured product of the composition (X) by the polyphenylene ether chain, thus improving the heat resistance of the cured product and also improving the moldability of the composition (X). The reason is presumably as follows. If the weight mean molecular weight of unmodified polyphenylene ether falls within the range from approximately 500-5000, the polyphenylene ether has a relatively low molecular weight, and therefore, tends to decrease the heat resistance of the cured product. On the other hand, the compound (A2) has an unsaturated double bond at the terminal, and therefore, would improve the heat resistance of the cured product. Moreover, if the weight mean molecular weight of the compound (A2) is 5000 or less, the moldability of the composition (X) would not be easily inhibited. Therefore, the compound (A2) would improve not only the heat resistance of the cured product but also the moldability of the composition (X) as well. If the weight mean molecular weight of the compound (A2) is 500 or more, the glass transition temperature of the cured product does not easily decrease, and therefore, the cured product tends to have good heat resistance. Furthermore, this reduces the chances of shortening the polyphenylene ether chain in the compound (A2), thus allowing the cured product to maintain excellent dielectric properties due to the presence of the polyphenylene ether chain. Furthermore, if the weight mean molecular weight is 5000 or less, the compound (A2) is easily dissolved in a solvent, thus reducing the chances of causing a decline in the preservation stability of the composition (X). In addition, the compound (A2) does not tend to increase the viscosity of the composition (X), thus easily achieving good moldability for the composition (X).

The average number of substituents having a carbon-carbon unsaturated double bond (the number of terminal functional groups) per molecule of the compound (A2) is suitably 1 to 5, more suitably 1 to 3, and even more suitably 1.5 to 3. This facilitates ensuring sufficiently high heat resistance for the cured product of the composition (X) and reduces the chances of the reactivity and viscosity of the compound (A2) becoming excessively high. In addition, this also reduces the chances of unreacted unsaturated double bonds remaining after the composition (X) has been cured. Note that the number of terminal functional groups of the compound (A2) is the average of the substituents per molecule in 1 mol of the compound (A2). The number of terminal functional groups may be obtained, when the compound (A2) is synthesized by modifying polyphenylene ether, for example, by measuring the number of hydroxyl groups in the compound (A2) and calculating the decrease in the number of hydroxyl groups in the compound (A2) from the number of hydroxyl groups in the polyphenylene ether yet to be modified. The decrease from the number of hydroxyl groups in the polyphenylene ether yet to be modified is the number of terminal functional groups. The number of hydroxyl groups remaining in the compound (A2) may be determined by measuring the UV absorbance of a mixed solution obtained by adding a quaternary ammonium salt (tetraethylammonium hydroxide) associated with a hydroxyl group to a solution of the compound (A2).

The intrinsic viscosity of the compound (A2) suitably falls within the range from 0.03 dl/g to 0.12 dl/g, more suitably falls within the range from 0.04 dl/g to 0.11 dl/g, and even more suitably falls within the range from 0.06 dl/g to 0.095 dl/g. This further increases the chances of decreasing the dielectric constant and dielectric loss tangent of the cured product of the composition (X). Further, the moldability of the composition (X) may be improved by imparting sufficient flowability to the composition (X).

The intrinsic viscosity is an intrinsic viscosity measured in methylene chloride at 25° C. More specifically, the intrinsic viscosity is the viscosity at 25° C. of a solution prepared by dissolving the compound (A2) in methylene chloride at a concentration of 0.18 g/45 ml. This viscosity is measured by, for example, a viscometer AVS500 Visco System manufactured by Schott.

The method for synthesizing the compound (A2) is not limited to any particular one. For example, the compound (A2) may be synthesized by allowing polyphenylene ether to react to a compound having a structure in which a substituent having a carbon-carbon unsaturated double bond and a halogen atom are bonded. More specifically, polyphenylene ether and a compound having a structure in which a substituent having a carbon-carbon unsaturated double bond and a halogen atom are bonded are dissolved in a solvent and stirred up. As a result, the polyphenylene ether reacts to the compound having a structure in which a substituent having a carbon-carbon unsaturated double bond and a halogen atom are bonded to each other, thus forming the compound (A2).

Examples of the compound having a structure in which a substituent having a carbon-carbon unsaturated double bond and a halogen atom are bonded to each other include p-chloromethylstyrene and m-chloromethylstyrene. The raw material polyphenylene ether is not particularly limited as long as the compound (A2) may be finally synthesized. The polyphenylene ether contains at least one selected from the group consisting of a polyphenylene ether composed of 2,6-dimethylphenol and at least one of a bifunctional phenol and a trifunctional phenol, and a polyphenylene ether such as poly(2,6-dimethyl-1,4-phenylene oxide). The bifunctional phenol is a phenol compound having two phenolic hydroxyl groups per molecule, and contains, for example, at least one selected from the group consisting of tetramethylbisphenol A, biphenol and tetraalkylbiphenol. The trifunctional phenol is a phenol compound having three phenolic hydroxyl groups per molecule.

It is particularly suitable that the compound (A) contains both the copolymer (A1) and the compound (A2). This particularly significantly increases the chances of decreasing the dielectric constant and dielectric loss tangent of the cured product.

If the compound (A) contains both the copolymer (A1) and the compound (A2), the content of the copolymer (A1) with respect to 100 parts by mass of the compound (A2) suitably falls within the range from 10 parts by mass to 200 parts by mass. Setting the content of the copolymer (A1) at 10 parts by mass or more facilitates not only improving the moldability significantly particularly when the composition (X) is formed into a film shape but also decreasing the dielectric constant of the cured product particularly significantly. Setting the content of the copolymer (A1) at 200 parts by mass or less allows the flexibility of the resin sheet made from the composition (X) to be increased and facilitates decreasing the coefficient of linear expansion of the cured product particularly easily.

The compound (A) may contain only the copolymer (A1) and the compound (A2). Alternatively, the compound (A) may contain not only the copolymer (A1) and the compound (A2) but also another compound (A3) other than the copolymer (A1) and the compound (A2).

If the compound (A) contains the compound (A3), the compound (A3) suitably contains at least one selected from the group consisting of a monofunctional compound and a polyfunctional compound. If the compound (A3) contains a monofunctional compound, the monofunctional compound contains at least one compound selected from the group consisting of 1-octadecene, stearyl methacrylate, dicyclopentanyl methacrylate, and isobornyl methacrylate. If the compound (A3) contains a polyfunctional compound, the polyfunctional compound suitably includes at least one component selected from the group consisting of divinylbenzene, dicyclopentadiene, methylcyclopentadiene dimer, trivinylcyclohexane, triallyl isocyanurate (TALC), dicyclopentadiene dimethanol dimethacrylate, nonanediol dimethacrylate, 1,3-diisopropenylbenzene, and trimethylolpropane triacrylate. Examples of commercially available polyfunctional compounds include TA-G, LDAIC, and DD-1 manufactured by Shikoku Chemicals Co., Ltd. If the compound (A3) contains a polyfunctional compound, it is easy to improve the flame retardancy of the cured product of the composition (X).

The compound (A3) may contain maleimide. This facilitates improving the flame retardancy of the cured product. Maleimide contains at least one compound selected from the group consisting of phenylmaleimide, cyclohexylmaleimide, 4,4'-diphenylmethane bismaleimide, m-phenylene bismaleimide, bisphenol A diphenylether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl) hexane. Examples of commercially available bismaleimides include BMI-689 and BMI-3000 (names of products manufactured by DESIGNER MOLECULES) and MIR-3000 manufactured by Nippon Kayaku Co., Ltd.

If the compound (A) contains the copolymer (A1), the compound (A2), and the compound (A3), the content of the compound (A3) suitably falls within the range from 1 part by mass to 50 parts by mass with respect to 100 parts by mass in the total of the copolymer (A1) and the compound (A2). Setting the content of the compound (A3) at 1 part by mass or more allows the cured product of the composition (X) to have increased heat resistance. Setting the content of the compound (A3) at 50 parts by mass or less allows the cured product of the composition (X) to have its dielectric constant and dielectric loss tangent decreased and reduces the chances of a resin sheet made from the composition (X) coming to have tackiness.

The composition (X) suitably contains a thermal radical polymerization initiator (B). The thermal radical polymerization initiator (B) may promote the thermal radical polymerization reaction of the compound (A) by generating an active species when the composition (X) is heated. The composition (X) does not have to contain the thermal radical polymerization initiator (B) as long as the compound (A) contains a component that easily generates an active species when the compound (A) is heated.

The thermal radical polymerization initiator (B) may contain, for example, at least one of an azo compound and a peroxide. The azo compound contains, for example, azobisisobutyronitrile. The peroxide may contain at least one compound selected from the group consisting of α,α'-di(t-butylperoxy) diisopropylbenzene, α,α'-bis(t-butylperoxy-m-isopropyl) benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butyl phenoxyl, t-butyl peroxyisopropyl monocarbonate, t-amyl peroxy neodecanoate, t-amyl peroxypivalate, t-amyl peroxy-2-ethyl hexanoate, t-amyl peroxy normal octoate, t-amylperoxyacetate, t-amylperoxyisononanoate, t-amylperoxybenzoate, t-amylperoxyisopropyl carbonate, di-t-amyl peroxide, and 1,1-di(t-amylperoxy) cyclohexane. The compound that the thermal radical polymerization initiator (B) may contain is not limited to these.

The thermal radical polymerization initiator (B) suitably contains a peroxide. This increases the chances of increasing the glass transition temperature of the cured product.

If the thermal radical polymerization initiator (B) contains a peroxide, the peroxide suitably contains at least one compound selected from the group consisting of a t-amyl peroxide-based polymerization initiator and a t-hexyl peroxide-based polymerization initiator. In that case, the peroxide hardly increases the dielectric loss tangent of the cured product while increasing the glass transition temperature of the cured product. The azo compound is also suitable in that the azo compound hardly increases the dielectric loss tangent of the cured product.

The t-amyl peroxide-based polymerization initiator may contain, for example, at least one compound selected from the group consisting of t-amyl peroxy neodecanoate, t-amyl peroxy pivalate, t-amyl peroxy-2-ethyl hexanoate, t-amyl peroxy normal octoate, t-amylperoxy acetate, t-amylperoxyisono nanoate, t-amylperoxy benzoate, t-amylperoxyisopropyl carbonate, di-t-amyl peroxide, and 1,1-di(t-amylperoxy) cyclohexane.

The t-hexyl peroxide-based polymerization initiator may contain, for example, di-t-hexyl peroxide.

If the composition (X) contains the thermal radical polymerization initiator (B), the content of the thermal radical polymerization initiator (B) may fall, for example, within the range of 0.1 parts by mass to 5 parts by mass with respect to 100 parts by mass of the compound (A).

As described above, the organic radical compound (C) facilitates improving the preservation stability of the composition (X) and a dried product and a semi-cured product thereof, and also facilitates reducing an increase in the coefficient of linear expansion and curbing a decrease in the glass transition temperature of the cured product involved with the preservation.

The organic radical compound (C) suitably contains an organic nitroxide radical compound (C1). This particularly significantly facilitates the organic radical compound (C) having the above-described effect.

The organic nitroxide radical compound (C1) may contain, for example, at least one compound selected from the group consisting of: the compound expressed by the following Formula (7); the compound expressed by the following Formula (8); the compound expressed by the following Formula (9); the compound expressed by the following Formula (10); and the compound expressed by the following Formula (11). The compound that the organic nitroxide radical compound (C1) may contain is not limited to these. In Formula (10), n is a number falling within the range from 1 to 18. In Formula (11), R is hydrogen or a hydroxyl group.

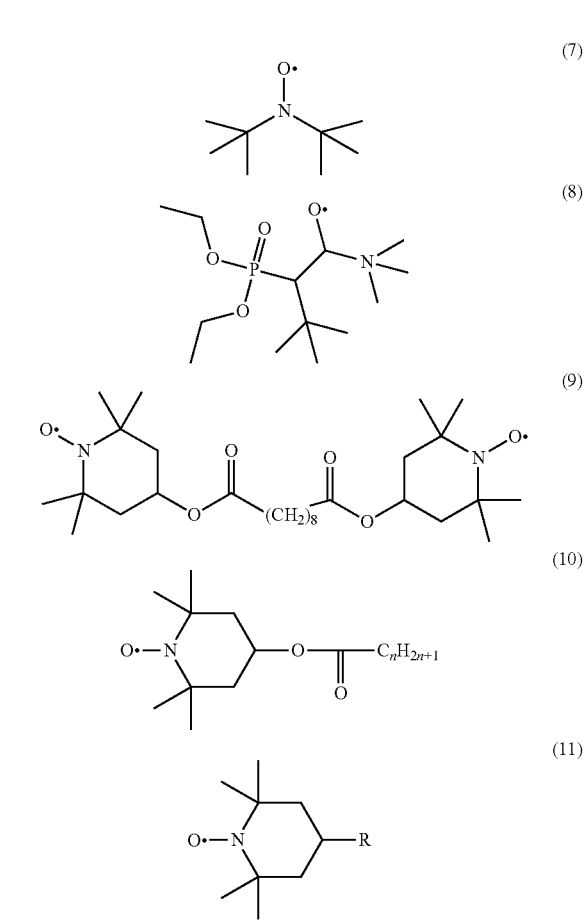

The organic nitroxide radical compound (C1) suitably contains at least one component selected from the group consisting of 2,2,6,6-tetramethylpiperidine 1-oxyl and derivatives thereof. For example, the organic nitroxide radical compound (C1) suitably contains at least one component selected from the group consisting of the compound expressed by Formula (9), the compound expressed by Formula (10), and the compound expressed by Formula (11).

The organic nitroxide radical compound (C1) particularly suitably contains the compound expressed by Formula (11). More suitably, R in Formula (11) is hydrogen. This particularly significantly facilitates improving the dielectric properties of the cured product.

The content of the organic radical compound (C) with respect to the compound (A) suitably falls within the range from 0.01% by mass to 5.0% by mass. If its content is 0.05% by mass or more, moldability may be improved. If its content is 5.0% by mass or less, the coefficient of linear expansion of the cured product may be reduced. The content of the organic radical compound (C) more suitably falls within the range from 0.05% by mass to 4.0% by mass, and even more suitably falls within the range from 0.05% by mass to 3.0% by mass.

The composition (X) may contain a metal deactivator (D). The metal deactivator (D) may inactivate, when the composition (X), a dried product thereof, a semi-cured product thereof, or a cured product thereof comes into contact with a conductor such as conductor wiring, ions (for example, copper ions) derived from the conductor. Therefore, the inactivation of those ions derived from the conductor reduces the chances of generating a highly polar component due to an oxidation-reduction reaction a component of the composition (X), the dried product thereof, the semi-cured product thereof, or the cured product thereof with ions (for example, copper ions) in the conductor. This reduces the chances of the dielectric loss tangent of the cured product increasing due to the presence of ions derived from the conductor. In particular, if the composition (X) contains the copolymer (A1), the copolymer (A1) originally tends to cause an oxidation-reduction reaction with the ions. However, the metal deactivator (D) reduces the chances of causing the oxidation-reduction reaction between the copolymer (A1) and the ions. That is to say, the metal deactivator (D) achieves a particularly advantageous effect when the composition (X) contains the copolymer (A1).

The metal deactivator (D) contains at least one compound selected from the group consisting of: 2-hydroxy-N-1H-1, 2,3-triazol-3-yl benzamide, N'1,N'12-bis(2-hydroxybenzoyl) dodecanedihydrazide, and N,N'-bis[3-(3,5-di-tert-butyl-4-hydroxyphenyl)propyonyl]hydrazine. Examples of commercially available metal deactivators (D) include ADEKA STAB CDA-1, ADEKA STAB CDA-6, and ADEKA STAB CDA-10 manufactured by ADEKA CORPORATION. The components that the metal deactivator (D) may contain are not limited to these.

The content of the metal deactivator (D) suitably falls within the range from 0.01% by mass to 5.0% by mass with respect to the compound (A). If the content of the metal deactivator (D) is 0.01% by mass or more, an increase in dielectric loss tangent during high temperature treatment of the cured product may be reduced. If the content of the metal deactivator (D) is 5.0% by mass or less, a cured product having a low dielectric constant and a low dielectric loss tangent may be obtained. The content of the metal deactivator (D) more suitably falls within the range from 0.01% by mass to 3.0% by mass, and even more suitably falls within the range from 0.05% by mass to 2.0% by mass.

The composition (X) may contain a styrene-based elastomer (E). The elastomer (E) is a copolymer including, for example, an olefin unit and a styrene unit. The olefin unit is a structural unit derived from an olefin monomer, and the styrene unit is a structural unit derived from a styrene monomer. The styrene monomer is at least one selected from the group consisting of styrene and styrene having a substituent. The substituent is, for example, an alkyl group such as a methyl group. In particular, the styrene monomer suitably contains at least one of styrene and methylstyrene. The methylstyrene includes at least one selected from the group consisting of α-methylstyrene, β-methylstyrene, 2-methylstyrene, 3-methylstyrene, and 4-methylstyrene.

The elastomer (E) may increase the compatibility between the copolymer (A1) and the compound (A2) when the composition (X) contains the copolymer (A1) and the compound (A2). Thus, the elastomer (E) may improve the flame retardancy of the cured product. The styrene-based elastomer may not only improve the moldability when the composition (X) is formed into a sheet shape to form a resin sheet but also improve the tenacity of the semi-cured product and cured product thereof.

The elastomer (E) may be a random copolymer or a block copolymer. If the elastomer (E) is a random copolymer, the elastomer (E) is a copolymer in which a plurality of olefin units and a plurality of styrene units are randomly arranged. If the elastomer (E) is a block copolymer, the elastomer (E) is a copolymer in which one or more olefin blocks and one or more styrene blocks are arranged. The olefin block is composed of a plurality of olefin units, and the styrene block is composed of a plurality of styrene units. If the elastomer (E) is a random copolymer, the elastomer (E) may be produced, for example, by polymerizing an olefin monomer and a styrene monomer by an emulsion polymerization method or a solution polymerization method.

If the elastomer (E) is a block copolymer, the elastomer (E) may be produced, for example, by block-polymerizing the olefin monomer and the styrene monomer in an inert solvent in the presence of a lithium catalyst.

The plurality of olefin units in the elastomer (E) suitably include at least one selected from the group consisting of ethylene units, propylene units, butylene units, α-olefin units, butadiene units, hydrogenated butadiene units, isoprene units, and hydrogenated isoprene units. The olefin unit particularly suitably includes a hydrogenated isoprene unit. This facilitates increasing the stability of the composition (X).

The mass ratio of the olefin unit and the styrene unit in the elastomer (E) is suitably falls within the range from 30:70 to 90:10, and more suitably falls within the range from 60:40 to 85:15. This allows the compatibility between the copolymer (A1) and the compound (A2) to be improved particularly significantly.

The content of the elastomer (E) in the composition (X) may be set appropriately. Particularly when the composition (X) contains the copolymer (A1), the compound (A2), and the elastomer (E), the content of the elastomer (E) suitably falls within the range from 5 parts by mass to 100 parts by mass with respect to 100 parts by mass in total of the copolymer (A1) and the compound (A2). If the content of the elastomer (E) is 5 parts by mass or more, the elastomer (E) tends to sufficiently increase the compatibility between the copolymer (A1) and the compound (A2), thus allowing the composition (X) to be formed into a film shape with good stability. If the content of the elastomer (E) is 100 parts by mass or less, an increase in the coefficient of linear expansion of the cured product may be reduced and heat resistance and flame retardancy thereof may be improved.

The composition (X) may contain an inorganic filler (F). The inorganic filler (F) may decrease the coefficient of linear expansion of the cured product, further improve the dielectric properties of the cured product, and improve the heat resistance and flame retardancy of the cured product.

Examples of the inorganic filler (F) include at least one material selected from the group consisting of: silica, alumina, talc, aluminum hydroxide, magnesium hydroxide, titanium oxide, mica, aluminum borate, barium sulfate, boron nitride, forsterite, zinc oxide, magnesium oxide and calcium carbonate.

The inorganic filler (F) is suitably subjected to surface treatment with a surface treatment agent having a polymerizable unsaturated group. In other words, the particles of the inorganic filler (F) suitably have, on the surface thereof, a polymerizable unsaturated group derived from the surface treatment agent. The polymerizable unsaturated group includes, for example, at least one group selected from the group consisting of a vinyl group, an allyl group, a methacrylic group, a styryl group, an acryloyl group, a methacryloyl group, and a maleimide group. Examples of the surface treatment agent include a silane coupling agent having a polymerizable unsaturated group. The group that the polymerizable unsaturated group may contain and the component that the surface treatment agent may contain are not limited to these.

If the inorganic filler (F) is subjected to surface treatment with a surface treatment agent having a polymerizable unsaturated group, the polymerizable unsaturated group in the inorganic filler (F) may react to the compound (A), thus allowing the cured product to have an increased crosslink density. Therefore, the inorganic filler (F) is likely to further decrease the coefficient of linear expansion of the cured product and further increase the glass transition temperature of the cured product.

If the composition (X) contains the inorganic filler (F), the content of the inorganic filler (F) suitably falls within the range from 30 parts by mass to 500 parts by mass with respect to 100 parts by mass in total of the compound (A). If the content of the inorganic filler (F) is 30 parts by mass or more, the inorganic filler (F) may decrease the coefficient of linear expansion of the cured product particularly significantly, improve the dielectric properties of the cured product particularly easily, and improve the heat resistance and flame retardancy of the cured product particularly significantly. If the content of the inorganic filler (F) is 500 parts by mass or less, the composition (X) is allowed to maintain its flowability easily during molding.

The composition (X) may contain a flame retardant (G). If the flame retardant (G) is contained, the flame retardancy of the composition (X) may be improved.

In this embodiment, the flame retardancy of the cured product may be improved by the organic radical compound (C) as described above. If the composition (X) contains the flame retardant (G), the flame retardancy of the cured product may be further improved. Moreover, since the flame retardancy of the cured product is improved by the organic radical compound (C), the content of the flame retardant (G) when the flame retardant (G) is added to the composition (X) may be decreased.

The flame retardant (G) may include a flame retardant (F1) containing bromine or phosphorus. In that case, the flame retardant (F1) may improve the flame retardancy of the cured product while decreasing the dielectric constant of the cured product. The flame retardant (F1) may contain at least one of a bromine-containing flame retardant (F11) or a phosphorus-containing flame retardant (F12).

The flame retardant (F11) suitably contains, for example, an aromatic bromine compound. The flame retardant (F11) suitably contains at least one selected from the group consisting of decabromodiphenylethane, 4,4-dibromobiphenyl, and ethylene-bistetrabromophthalimide.

If the composition (X) contains the flame retardant (F1), the content of bromine in the flame retardant (F1) with respect to the composition (X) suitably falls within the range from 8% by mass to 20% by mass. This particularly significantly improves the flame retardancy of the cured product and significantly decreases the chances of bromine being dissociated from the cured product when the cured product is heated.

The flame retardant (F12) contains, for example, at least one of an incompatible phosphorus compound or a compatible phosphorus compound.

The incompatible phosphorus compound suitably contains, for example, a phosphine oxide compound having two or more diphenylphosphine oxide groups per molecule. The melting point of this phosphine oxide compound is suitably 280° C. or higher. The phosphine oxide compound suitably includes a compound which is one or more linking groups selected from the group consisting of a phenylene group, a xylylene group, a biphenylene group, a naphthylene group, a methylene group, and an ethylene group, and which has a structure in which two or more diphenylphosphine oxide groups are linked.

The compatible phosphorus compound suitably contains at least one selected from the group consisting of a phosphoric acid ester compound, a phosphazene compound, a phosphorous acid ester compound, and a phosphine compound.

If the composition (X) contains the flame retardant (F12), the content of phosphorus in the flame retardant (F12) with respect to the composition (X) suitably falls within the range from 2.0% by mass to 6.0% by mass. This improves the flame retardancy of the cured product and decreases the chances of phosphorus being dissociated from the cured product when the cured product is heated.

The composition (X) may contain a solvent. The solvent suitably contains at least one component selected from the group consisting of an aliphatic hydrocarbon solvent, an aromatic hydrocarbon solvent and a ketone solvent. If the composition (X) contains a solvent, the moldability when the composition (X) is formed into a sheet shape may be improved easily.

The composition (X) may contain appropriate components other than the above-described ones. For example, the composition (X) may contain at least one component selected from the group consisting of a defoaming agent such as a silicone defoaming agent or an acrylic acid ester defoaming agent, a heat stabilizer, an antistatic agent, an ultraviolet absorber, a dye, a pigment, a lubricant, and a wetting dispersant. Optionally, the composition (X) may contain additional components other than these.

A resin sheet according to this embodiment includes a dried product or semi-cured product of the composition (X). The resin sheet may be used as a material for a laminate or a printed wiring board. An insulating layer including a cured product of the composition (X) may be formed by causing the resin sheet to be cured.

To manufacture a resin sheet, for example, first, the composition (X) is formed into a sheet shape. Examples of methods for forming the composition (X) include a coating method. However, this is only an example and should not be construed as limiting. Next, the composition (X) is heated to be either dried or semi-cured. In this manner, a resin sheet including a dried product or semi-cured product of the composition (X) may be obtained. The heating temperature at the time of heating has only to be high enough to dry the solvent included in the composition (X) or turn the composition (X) into a semi-cured product and may fall within the range from 100° C. to 160° C., for example. The heating duration at the time of heating may fall within the range from 5 minutes to 10 minutes, for example.

An insulating layer including a cured product of the composition (X) may be formed by heating and curing the resin sheet as described above. The heating temperature at the time of heating may fall within the range from 160° C. to 220° C., for example, and suitably falls within the range from 180° C. to 220° C. The heating duration at the time of heating may fall within the range from 30 minutes to 240 minutes, for example, and suitably falls within the range from 60 minutes to 240 minutes.

The temperature at which the resin sheet exhibits the lowest melt viscosity is suitably equal to or higher than 140° C. This facilitates maintaining a low viscosity when the resin sheet is heated and melted. This temperature is more suitably equal to or higher than 160° C. Furthermore, the temperature at which the resin sheet exhibits the lowest melt viscosity is suitably equal to or lower than 180° C. This may prevent the temperature of the heating to be performed to allow the resin sheet melted to be cured from becoming too high. Furthermore, the temperature at which the resin sheet exhibits the lowest melt viscosity may be achieved by the above-described chemical makeup of the composition (X). The temperature at which the resin sheet exhibits the lowest melt viscosity may be confirmed in the following manner. Using a rheometer (model number Rheosol G-3000 manufactured by UBM Co., Ltd.) and a parallel plate, the melt viscosity of the resin sheet is measured under the measuring condition including a temperature increase rate of 3° C./min. and a frequency of 0.009 rad/s in a range having a heating width of 50° C. to 250° C. The temperature at which the resin sheet exhibits the lowest melt viscosity may be confirmed based on a melt viscosity curve showing a relationship between the temperature and the melt viscosity thus obtained.

Figure 1B:
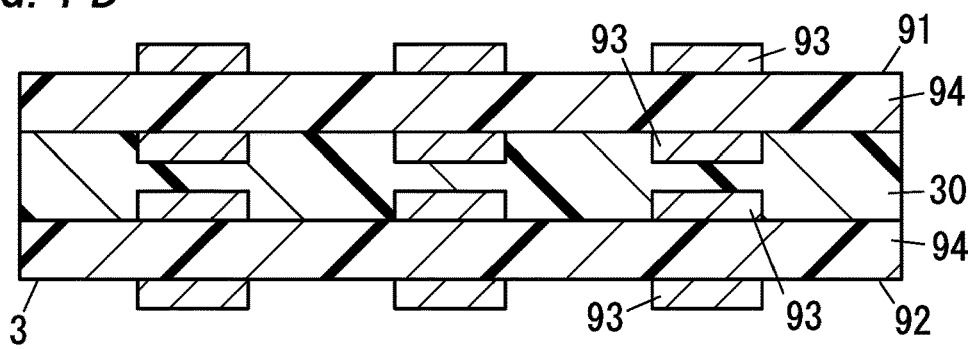
FIG. 1B is a cross-sectional view schematically illustrating an exemplary printed wiring board formed by using the resin sheet shown in FIG. 1A.

The resin sheet may be used as a bonding sheet for bonding base members such as a plurality of printed wiring boards. Specifically, first, the composition (X) is applied onto, and formed into a sheet shape on, a supporting film 8 made of polyethylene terephthalate, for example, and then is allowed to be either dried or semi-cured, thereby forming a resin sheet 7 (see FIG. 1A). Next, the resin sheet 7 is affixed to base member (hereinafter referred to as a "first base member 91") such as a printed wiring board, and then the supporting film 8 is peeled off from the resin sheet 7. Next, another base member (hereinafter referred to as a "second base member 92") is laid on top of the resin sheet 7 on the first base member 91. In this manner, a multilayer stack including the first base member 91, the second base member 92, and the resin sheet 7 interposed between the first base member 91 and the second base member 92 is obtained. Subjecting this multilayer stack to thermal pressing causes the resin sheet 7 to be melted and then cured, thereby forming an insulating layer 30 (as an adhesive layer). This allows the first base member 91 and the second base member 92 to be bonded together via the insulating layer 30. In this case, if a surface, laid on top of the resin sheet 7, of at least one of the first base member 91 or the second base member 92 has conductor wiring 93, then the resin sheet 7 covering the conductor wiring 93 is melted and then cured, thus allowing the insulating layer 30 made from the resin sheet 7 to sufficiently close the gaps of the conductor wiring 93. Bonding the base members with the resin sheet 7 in this manner allows a multilayer printed wiring board 3 such as the one shown in FIG. 1B to be manufactured. The multilayer printed wiring board 3 includes: an insulating layer 94 and conductor wiring 93 derived from the first base member 91; an insulating layer 94 and conductor wiring 93 derived from the second base member 92; and the insulating layer 30 formed out of the resin sheet 7 interposed between the first base member 91 and the second base member 92.

Figure 2A:
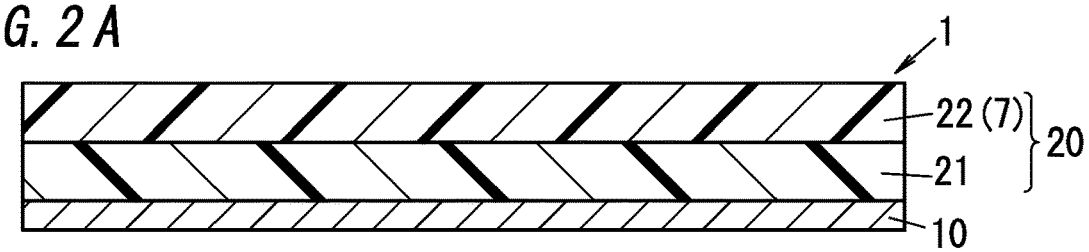
FIGS. 2A and 2B are cross-sectional views schematically illustrating exemplary sheets of metal foil with resin according to the exemplary embodiment of the present disclosure.

Next, a sheet of metal foil 1 with resin will be described. As shown in FIG. 2A, the sheet of metal foil 1 with resin includes a sheet of metal foil 10 and a resin layer 20 laid on top of the sheet of metal foil 10. The resin layer 20 includes the resin sheet 7 described above. A laminate or a printed wiring board may be formed based on this sheet of metal foil 1 with resin.

The sheet of metal foil 10 may be a sheet of copper foil, for example. The sheet of metal foil 10 may have a thickness falling within the range from 2 μm to 105 μm, for example, and suitably has a thickness falling within the range from 5 μm to 35 μm. The sheet of metal foil 10 may be, for example, a sheet of copper foil having a thickness of 2 μm which forms part of a combination of the sheet of copper foil and a sheet of carrier copper foil having a thickness of 18 μm.

The resin layer 20 shown in FIG. 2A includes: a first resin layer 21 laid on top of the sheet of metal foil 10; and a second resin layer 22 laid on top of the first resin layer 21 and forming the outermost layer, located opposite from the sheet of metal foil 10, of the resin layer 20.

The second resin layer 22 is made of the resin sheet 7. The first resin layer 21 has a different composition from the second resin layer. In this case, a property corresponding to the composition of the first resin layer 21 is imparted to the resin layer 20 and an insulating layer formed out of the resin layer 20. For example, the first resin layer 21 imparts excellent flexibility to the insulating layer, thus allowing a flexible laminate or printed wiring board to be formed out of the sheet of metal foil 1 with resin.

The first resin layer 21 may have a thickness falling within the range from 1 μm to 50 μm, for example. The second resin layer 22 may have a thickness falling within the range from 5 μm to 200 μm, for example, and suitably has a thickness falling within the range from 10 μm to 150 μm.

The first resin layer 21 includes at least one component (hereinafter also referred to as a "particular resin component") selected from the group consisting of, for example, a liquid crystal polymer resin, a polyimide resin, a polyamide imide resin, a fluororesin, and a polyphenylene ether resin. The first resin layer 21 may be made from, for example, a resin solution or sheet material including the component described above. Optionally, the sheet material may include a base member such as a piece of glass cloth therein and may be reinforced with the base member. The sheet material may be a prepreg, for example. The first resin layer 21 may be formed by, for example, either applying a resin solution onto the sheet of metal foil 10 and drying the resin solution or laying a sheet material on top of the sheet of metal foil 10 and then thermally pressing the sheet material.

Figure 2B:
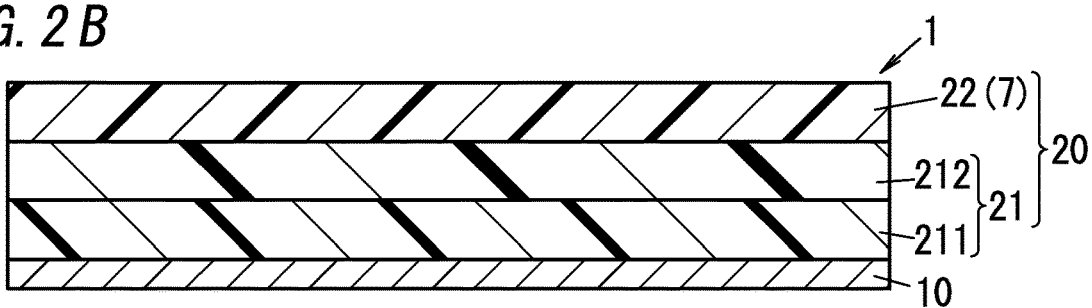

The first resin layer 21 may be a single layer as shown in FIG. 2A but may include a plurality of layers. For example, the first resin layer 21 may include a first layer 211 and a second layer 212 having mutually different compositions as shown in FIG. 2B. For example, the first layer 211 and the second layer 212 may each include the particular resin component and may have mutually different compositions. Alternatively, the first resin layer 21 may include three or more layers.

The second resin layer 22 may be formed out of the resin sheet 7 as described above. For example, the composition (X) is applied onto the first resin layer 21 and formed into a sheet shape by a coating method or any other suitable method, and then heated to be either dried or semi-cured. In this manner, the second resin layer 22 may be formed out of the resin sheet 7.

The resin layer 20 may be a single layer consisting of the resin sheet 7 alone. In that case, such a resin layer 20 consisting of the resin sheet 7 alone may be formed by, for example, applying the composition (X) onto the sheet of metal foil 10 by a coating method or any other suitable method, forming the composition (X) into a sheet shape, and then heating the composition (X) to either dry or semi-cure the composition (X).

A laminate 2 according to this embodiment will be described. As shown in FIGS. 3A-3D, the laminate 2 includes the insulating layer 30 and the sheet of metal foil 10.

The laminate 2 includes the sheet of metal foil 10 as its outermost layer. The laminate 2 may include either a single sheet of metal foil 10 or multiple sheets of metal foil 10, whichever is appropriate. If the laminate 2 includes multiple sheets of metal foil 10, then the laminate 2 includes one of the multiple sheets of metal foil 10 as its outermost layer.

The insulating layer 30 includes a cured product of the composition (X). Optionally, the insulating layer 30 may further include the particular resin component.

Figure 3A:
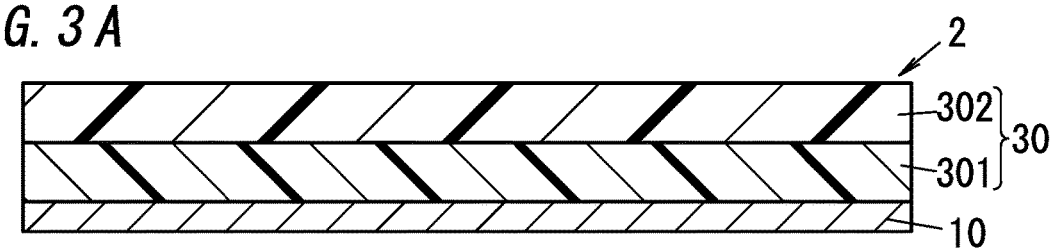
FIGS. 3A, 3B, 3C, and 3D are cross-sectional views schematically illustrating exemplary metal-clad laminates according to the exemplary embodiment of the present disclosure.
Figure 3B:
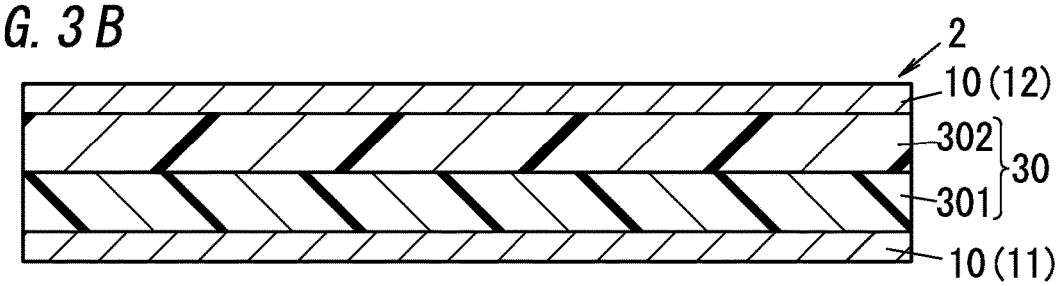
Figure 3C:
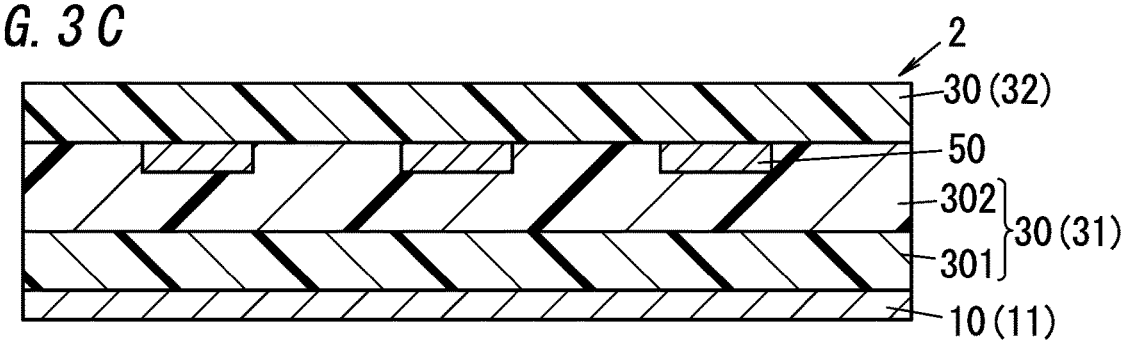
Figure 3D:
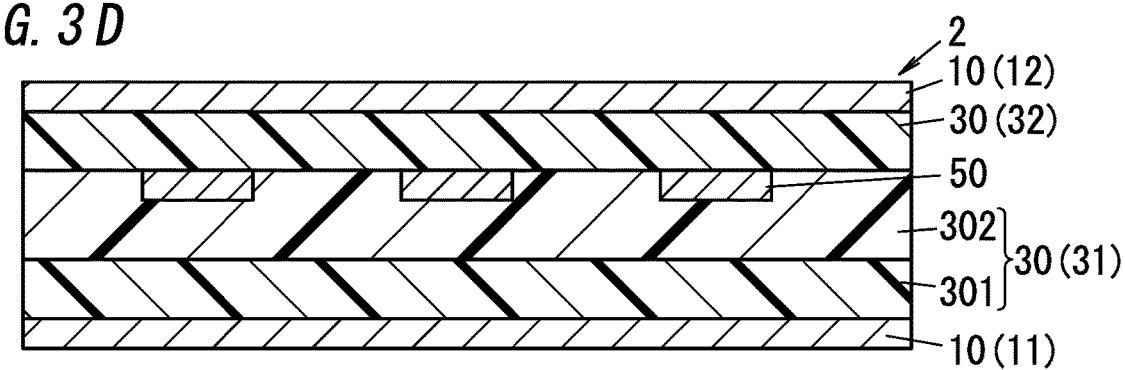

The laminate 2 may include either only one insulating layer 30 as shown in FIGS. 3A and 3B or two or more insulating layers 30 as shown in FIGS. 3C and 3D.

If the laminate 2 includes only one insulating layer 30, then the insulating layer 30 either consists of only a layer including a cured product of the composition (X), for example, or includes a second layer 302 including a cured product of the composition (X) and a first layer 301 other than the second layer 302. The first layer 301 may include, for example, the particular resin component. The first layer 301 may have a thickness falling within the range from 1 μm to 50 μm, for example, and the second layer 302 may have a thickness falling within the range from 5 μm to 50 μm, for example.

If the laminate 2 includes two or more insulating layers 30, then at least one of the two or more insulating layers 30 may include a cured product of the composition (X). Also, at least one of the two or more insulating layers 30 may include the particular resin component. Alternatively, at least one of the two or more insulating layers 30 may include a cured product of the composition (X) and the particular resin component. In that case, at least one of the two or more insulating layers 30 may be a layer including the first layer 301 and the second layer 302 laid on top of the first layer 301. Each of the two or more insulating layers 30 may include the particular resin component.

The material and thickness of the sheet of metal foil 10 may be the same as those of the sheet of metal foil 10 included in the sheet of metal foil with resin described above.

Forming the laminate 2 including the insulating layer 30 that includes a cured product of the composition (X) facilitates increasing the heat resistance, decreasing the coefficient of linear expansion, and improving the flame retardancy of the insulating layer 30.

The laminate 2 shown in FIG. 3A includes the sheet of metal foil 10, the first layer 301, and the second layer 302, which are stacked one on top of another in this order. The laminate 2 shown in FIG. 3A may be formed by, for example, heating the sheet of metal foil 1 with resin described above. However, this is not the only method for manufacturing the laminate 2. Alternatively, the laminate 2 may also be formed by, for example, stacking the sheet of metal foil 10, a sheet material containing the component of the first layer 301, and the resin sheet 7 described above in this order one on top of another and then subjecting the stack to thermal pressing. Alternatively, the sheet of metal foil 10, the second layer 302, and the first layer 301 may be stacked one on top of another in this order. Optionally, the first layer 301 may include two or more layers. In that case, two layers which are directly in contact with each other in the first layer 301 may have mutually different compositions.

The laminate 2 shown in FIG. 3B includes a sheet of metal foil 10 (as a first sheet of metal foil 11), the insulating layer 30, and another sheet of metal foil 10 (as a second sheet of metal foil 12), which are stacked one on top of another in this order. This laminate 2 may be formed by laying an additional sheet of metal foil on top of the resin layer 20 of the sheet of metal foil 1 with resin described above and subjecting the stack to thermal pressing. However, this is not the only method for manufacturing the laminate 2. Alternatively, the laminate 2 may also be formed by providing the first sheet of metal foil 11, a sheet material containing a component of the first layer 301, the resin sheet 7 described above, and the second sheet of metal foil 12, stacking these one on top of another in this order, and then subjecting the stack to thermal pressing.

The laminate 2 shown in FIG. 3C includes a sheet of metal foil 10 (as a first sheet of metal foil 11), an insulating layer 30 (as a first insulating layer 31), a conductor layer 50, and another insulating layer 30 (as a second insulating layer 32), which are stacked one on top of another in this order. The first insulating layer 31 includes the first layer 301 and the second layer 302. The first insulating layer 31 may have the same structure as the insulating layer 30 of the laminate 2 shown in FIG. 3A. The second insulating layer 32 includes at least one component selected from the group consisting of a cured product of the composition (X), a liquid crystal polymer resin, a polyimide resin, a polyamide imide resin, a fluororesin, and a polyphenylene ether resin. The conductor layer 50 is implemented as conductor wiring in this example but may also be implemented as a sheet of metal foil.

To form the laminate 2 shown in FIG. 3C, a core material including, for example, the second insulating layer 32 and a conductor layer 50 (conductor wiring) stacked thereon is provided. The resin layer 20 of the sheet of metal foil 1 with resin described above is laid on top of one surface, facing the conductor 50, of the core material. The laminate 2 may be formed by subjecting the core material and the sheet of metal foil 1 with resin to thermal pressing in this state. In this case, during the thermal pressing, the resin sheet 7 in the resin layer 20 of the sheet of metal foil 1 with resin is melted and then cured while being laid on top of the conductor layer 50, thus allowing the first insulating layer 31 formed out of the resin layer 20 to easily close the gaps of the conductor layer 50 sufficiently.

Note that this is not the only method for manufacturing the laminate 2. Alternatively, for example, the sheet of metal foil 10 (as a first sheet of metal foil 11), a sheet material containing the component of the first layer 301, the resin sheet 7 described above, the conductor layer 50, and a sheet material containing the component of the second insulating layer 32 are provided. The laminate 2 may also be formed by stacking these members one on top of another in this order and subjecting the stack to thermal pressing.

The laminate 2 shown in FIG. 3D includes a sheet of metal foil 10 (as a first sheet of metal foil 11), an insulating layer 30 (as a first insulating layer 31), a conductor layer 50, another insulating layer 30 (as a second insulating layer 32), and another sheet of metal foil 10 (as a second sheet of metal foil 12), which are stacked one on top of another in this order. The first insulating layer 31 includes the first layer 301 and the second layer 302. The conductor layer 50 is implemented as conductor wiring in this example but may also be implemented as a sheet of metal foil. That is to say, the laminate 2 shown in FIG. 3D has the same configuration as the laminate 2 shown in FIG. 3C except that the laminate 2 shown in FIG. 3D further includes the second sheet of metal foil 12.

To form the laminate 2, a core material, in which the second sheet of metal foil 12, the second insulating layer 32, and the conductor layer 50 (conductor wiring) are stacked one on top of another in this order, is provided. The resin layer 20 of the sheet of metal foil 1 with resin described above is laid on top of one surface, facing the conductor 50, of the core material. The laminate 2 may be formed by subjecting the core material and the sheet of metal foil 1 with resin to thermal pressing in this state. In this case, during the thermal pressing, the resin sheet 7 in the resin layer 20 of the sheet of metal foil 1 with resin is melted and then cured while being laid on top of the conductor layer 50, thus allowing the first insulating layer 31 formed out of the resin layer 20 to easily close the gaps of the conductor layer 50 sufficiently.

Note that this is not the only method for manufacturing the laminate 2. Alternatively, for example, the first sheet of metal foil 11, a sheet material containing the component of the first layer 301, the resin sheet 7 described above, the conductor layer 50, a sheet material containing the component of the second insulating layer, and the second sheet of metal foil 12 are provided. The laminate 2 may also be formed by stacking these members one on top of another in this order and subjecting the stack to thermal pressing.

The configuration of the laminate 2 is not limited to any of the specific examples shown in FIGS. 3A-3D. Alternatively, for example, the laminate 2 may include one or more sheets of metal foil 10, two or more conductor layers 50, and three or more insulating layers 30. Each of the conductor layers 50 is interposed between two adjacent insulating layers 30. The sheet of metal foil 10 forms the outermost layer of the laminate 2. At least one of the three or more insulating layers 30 contains a cured product of the composition (X). At least one of the three or more insulating layers 30 may contain the particular resin component, for example.

Next, a printed wiring board 3 according to this embodiment will be described. As shown in FIGS. 4A-4D, the printed wiring board 3 includes an insulating layer 30 and conductor wiring 60. The printed wiring board 3 includes the conductor wiring 60 as an outermost layer thereof. The insulating layer 30 contains a cured product of the composition (X). This facilitates increasing the heat resistance of the insulating layer 30, decreasing the coefficient of linear expansion thereof, and improving the flame retardancy thereof.

Figure 4A:
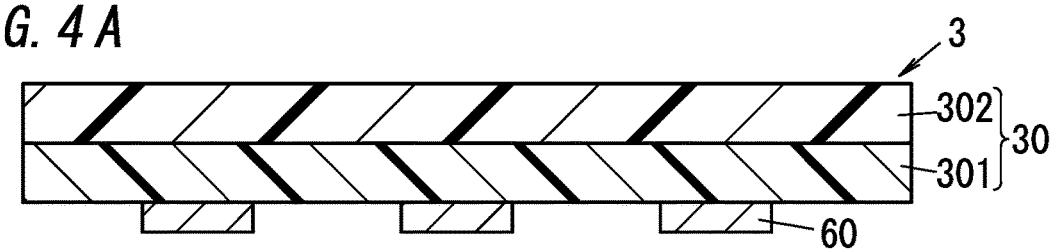
FIGS. 4A, 4B, 4C, and 4D are cross-sectional views schematically illustrating exemplary printed wiring boards according to the exemplary embodiment of the present disclosure.
Figure 4B:
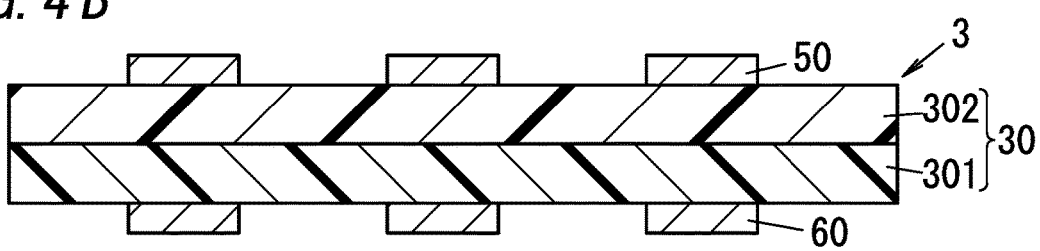
Figure 4C:
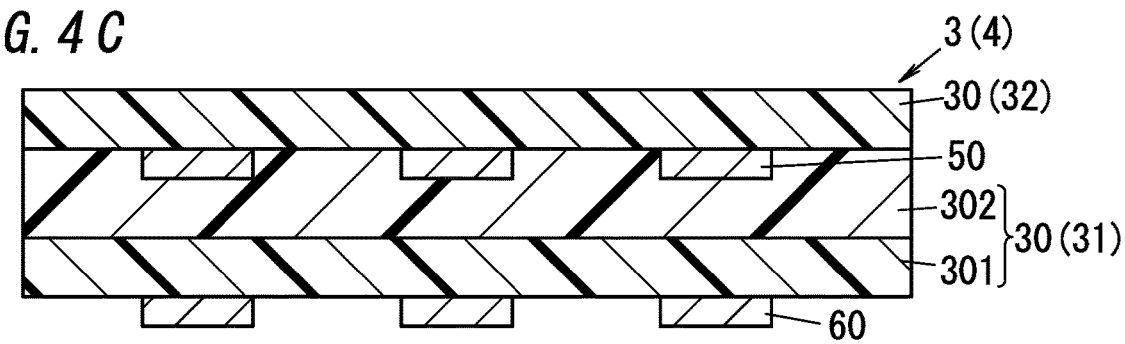
Figure 4D:
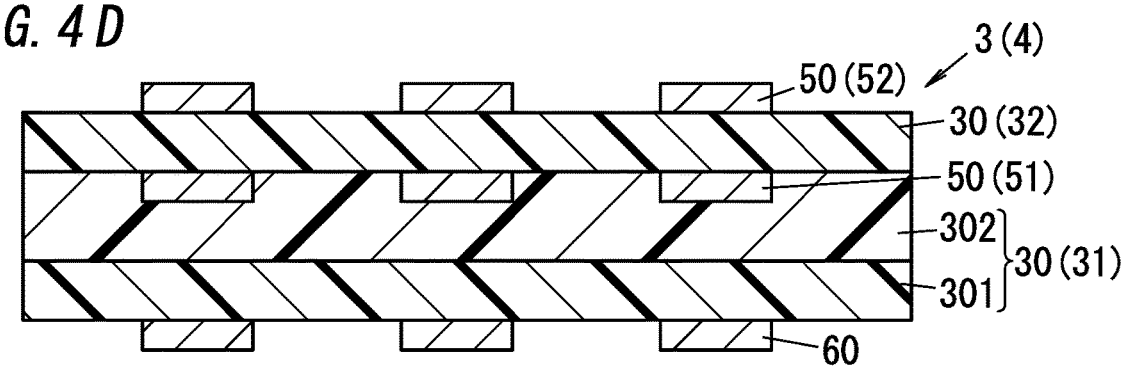

The printed wiring board 3 may include a single insulating layer 30 as shown in FIGS. 4A and 4B or may include a plurality of insulating layers 30 as shown in FIGS. 4C and 4D. If the printed wiring board 3 includes a plurality of insulating layers 30, at least one of the plurality of insulating layers 30 contains the composition (X). In addition, at least one of the insulating layers 30 suitably contains the particular resin component. The printed wiring board 3 shown in FIGS. 4C and 4D includes one or more layers of conductor wiring 60 and two or more insulating layers 30, and therefore, is also a multilayer printed wiring board 4.

The insulating layer 30 may be implemented as either a single layer or a plurality of layers, whichever is appropriate. The printed wiring board 3 shown in FIGS. 4A-4D includes the insulating layer 30 consisting of a first layer 301 and a second layer 302 laid on top of the first layer 301. The insulating layer 30 has the same configuration as the insulating layer 30 of the laminate 2 described above.

The printed wiring board 3 shown in FIGS. 4A-4D will be described in further detail.

The printed wiring board 3 shown in FIG. 4A includes conductor wiring 60, a first layer 301, and a second layer 302, which are stacked one on top of another in this order. The printed wiring board 3 has the same configuration as the laminate 2 shown in FIG. 3A, except that the printed wiring board 3 includes the conductor wiring 60 instead of the sheet of metal foil 10. The printed wiring board 3 may be fabricated by forming the conductor wiring 60 by, for example, removing (e.g., etching) excessive portions of the sheet of metal foil 10 of the laminate 2 shown in FIG. 3A.

The printed wiring board 3 shown in FIG. 4B includes the conductor wiring 60, an insulating layer 30, and a conductor layer 50, which are stacked one on top of another in this order. The printed wiring board 3 has the same configuration as the laminate 2 shown in FIG. 3B, except that the printed wiring board 3 includes the conductor wiring 60 instead of the first sheet of metal foil 10 and includes the conductor layer 50 (second conductor layer 52) instead of the second sheet of metal foil 12. The printed wiring board 3 may be fabricated by forming the conductor wiring 60 by, for example, removing (e.g., etching) excessive portions of the first sheet of metal foil 11 of the laminate 2 shown in FIG. 3B.

The printed wiring board 3 shown in FIG. 4C includes the conductor wiring 60, an insulating layer 30 (first insulating layer 31), the conductor layer 50, and another insulating layer 30 (second insulating layer 32), which are stacked one on top of another in this order. The printed wiring board 3 has the same configuration as the laminate 2 shown in FIG. 3C, except that the printed wiring board 3 includes the conductor wiring 60 instead of the sheet of metal foil 10. The printed wiring board 3 may be fabricated by forming the conductor wiring 60 by, for example, removing (e.g., etching) excessive portions of the sheet of metal foil 10 of the laminate 2 shown in FIG. 3C.

The printed wiring board 3 shown in FIG. 4D includes the conductor wiring 60, the insulating layer 30 (first insulating layer 31), a conductor layer 50 (first conductor layer 51), the insulating layer 30 (second insulating layer 32), and another conductor layer 50 (second conductor layer 52), which are stacked one on top of another in this order. The printed wiring board 3 has the same configuration as the laminate 2 shown in FIG. 3D, except that the printed wiring board 3 includes the conductor wiring 60 instead of the first sheet of metal foil 10 and includes the conductor layer 50 (second conductor layer 52) instead of the second sheet of metal foil 12. The printed wiring board 3 may be fabricated by forming the conductor wiring 60 by, for example, removing (e.g., etching) excessive portions of the first sheet of metal foil 11 of the laminate 2 shown in FIG. 3D.

The printed wiring boards 3 shown in FIGS. 4C and 4D each include two insulating layers 30. However, this is only an example and should not be construed as limiting. Alternatively, the printed wiring board 3 may include three or more insulating layers 30.

Examples

1. Preparing Composition and Forming Resin Sheet

A composition having a solid content concentration of 25% by mass was obtained by dissolving, in toluene, the components shown in the "Composition" column in Tables 1 to 4. A resin sheet having a thickness of 50 μm was formed on a polyethylene terephthalate film by applying the composition on a polyethylene terephthalate film using a comma coater and a dryer connected thereto and then heating the composition at 110° C. for 5 minutes.

The details of the components shown in Tables 1-4 are as follows.

Copolymer 1: ethylene-propylene-diene copolymer having a Mooney viscosity (ML (1+4) 100° C.) of 15, an ethylene content of 72%, and a diene content of 3.6%; X-3012P manufactured by Mitsui Chemicals, Inc.;

Copolymer 2: ethylene-propylene-diene copolymer having a Mooney viscosity (ML (1+4) 100° C.) of 20, an ethylene content of 77%, and a diene content of 10.4%; K-9720 manufactured by Mitsui Chemicals, Inc.;

PPE1: terminal-modified polyphenylene ether compound (styryl-modified polyphenylene ether compound) having a number average molecular weight of 1200; OPE-2St 1200 manufactured by Mitsubishi Gas Chemical Company, Inc.;

PPE2: terminal-modified polyphenylene ether compound (styryl-modified polyphenylene ether compound) having a number average molecular weight of 2400; OPE-2St 2400 manufactured by Mitsubishi Gas Chemical Company, Inc.;

PPE3: terminal-modified polyphenylene ether compound (methacryl-modified polyphenylene ether compound) having a number average molecular weight of 1600; SA-9000 manufactured by SABIC Innovative Plastics;

Unsaturated compound 1: triallyl isocyanurate; TAIC manufactured by Mitsubishi Chemical Corporation;

Unsaturated compound 2: bismaleimide; BMI-689 manufactured by DESIGNER MOLECULES;

Unsaturated compound 3: 1-octadecene;

Unsaturated compound 4: 1,3-diisopropylbenzene;

Unsaturated compound 5: dicyclopentanyl methacrylate;

Unsaturated compound 6: trimethylolpropane triacrylate;

Thermal radical polymerization initiator 1: di-t-hexyl peroxide; Perhexyl D manufactured by NOF CORPORATION;

Thermal radical polymerization initiator 2: di-t-amyl peroxide; Luperox DTA manufactured by ARKEMA Yoshitomi, Ltd.;

Thermal radical polymerization initiator 3: 1,1-di(t-amylperoxy) cyclohexane; Luperox 531 manufactured by ARKEMA Yoshitomi, Ltd.;

Thermal radical polymerization initiator 4: α,α'-di(t-butylperoxy) diisopropylbenzene, product name Perbutyl P manufactured by NOF CORPORATION;

Organic radical compound 1: 2,2,6,6-tetramethylpiperidine 1-oxyl, manufactured by TCI;

Organic radical compound 2: 4-hydroxy-2,2,6,6-tetramethylpiperidine 1-oxyl, manufactured by TCI;

Organic radical compound 3: bis(2,2,6,6-tetramethyl-4-piperidyl-1-oxyl) sebacate, manufactured by TCI;

Metal deactivator: N'1,N'12-bis(2-hydroxybenzoyl) dodecane dihydrazide, ADEKA STAB CDA-6 manufactured by ADEKA CORPORATION;

Elastomer 1: styrene ethylene butylene styrene block copolymer; Septon V9827 manufactured by Kuraray Co., Ltd.;

Elastomer 2: styrene ethylene butylene styrene block copolymer; Septon 8007 manufactured by Kuraray Co., Ltd.;

Elastomer 3: styrene-based elastomer; SE polymer manufactured by Denka Co., Ltd.;

Inorganic filler: spherical silica subjected to surface treatment with vinylsilane; product number 0.5 μm SV-CT1 (slurry containing 25% toluene), manufactured by Admatechs;

Flame retardant: phosphorus-containing flame retardant; PQ-60 manufactured by DKS Co., Ltd.; and Antioxidant: hindered phenolic antioxidant (Pentaerythritoltetrakis [3-(3,5-di-tert-butyl-4-hydroxyphenyl)propionate]); AO-60 manufactured by ADEKA CORPORATION.

2. Evaluation

The resin sheet was evaluated by the following method.

(1) Temperature at which Resin Sheet Exhibited Lowest Melt Viscosity

The melt viscosity of the resin sheet was measured within a heating range with a width of 50° C. to 250° C. with a rheometer (model number: Rheosol G-3000 manufactured by UBM Co., Ltd.) using parallel plates under the measuring condition including a temperature increase rate of 3° C./min and a frequency of 0.009 rad/s. The temperature at which the resin sheet exhibited the lowest melt viscosity was confirmed based on a melt viscosity curve showing a relationship between the temperature and the melt viscosity thus obtained.

(2) Dielectric Properties (Relative Dielectric Constant, Dielectric Loss Tangent, and ΔDf)

Two sheets of copper foil, each having a thickness of 18 μm, were arranged so that their glossy surfaces faced each other, and a resin sheet was arranged between the two sheets of copper foil. Samples for evaluation were formed by hot-pressing these under the condition including 200° C. and 2 MPa for 1 hour. This sample was subjected to an etching process to remove the sheets of copper foil from both sides and thereby obtain a test piece made of a cured product of the resin sheet. The relative dielectric constant and dielectric loss tangent of this test piece were measured at a test frequency of 10 GHz based on IPC TM-650 2.5.5.5.

Also, after the sample had been heated at 150° C. for 200 hours, the dielectric loss tangent of the sample was measured in the same manner as described above. Based on this result, the variation (ΔDf) in dielectric loss tangent due to heating was obtained. A decision may be made that the smaller the value of ΔDf is, the higher the stability of the dielectric loss tangent should be at the time of heating.

(3) Evaluation of Coefficient of Linear Expansion and Evaluation of Glass Transition Temperature By cutting a cured product that had been obtained by heating the resin sheet at 200° C. for 120 minutes under a vacuum, a sample for evaluation with dimensions of 5 mm×20 mm in a plan view was formed. The coefficient of linear expansion and the glass transition temperature of this sample were measured using a thermomechanical analyzer ("TMA/SS6100" manufactured by SII Nanotechnology Inc.) with a chuck length of 15 mm, a load of 10 g, and a temperature increase rate of 10° C./min until the temperature reached 350° C. Note that the coefficient of thermal expansion (α1) is the value of the coefficient of linear expansion below the glass transition temperature of the cured product, and the coefficient of thermal expansion (30-250° C. average) is the average value of the coefficient of thermal expansion calculated based on the result of measurement within the range from 30° C. to 250° C. If the coefficient of thermal expansion (α1) is 40 ppm/° C. or less, evaluation may be made that the increase in the coefficient of linear expansion is reduced If the coefficient of thermal expansion (30-250° C. average) is 50 ppm/° C. or less, evaluation may be made that the increase in the coefficient of linear expansion is reduced.

(4) Flame Retardancy

A plurality of resin sheets were laid one on top of another so that the total thickness was 200 μm, and the multilayer stack thus obtained was heated at 200° C. for 120 minutes under a vacuum to obtain a cured product. By cutting this cured product, a sample for evaluation having dimensions of 125 mm×13 mm in a plan view was formed. The flame retardancy of this sample was measured in compliance with the UL94 standard.

TABLE 1

| | | | Examples | | | | | | |
|---|---|---|---|---|---|---|---|---|---|
| | | | 1 | 2 | 3 | 4 | 5 | 6 | 7 |
| Composition (parts by mass) | A | A1 Copolymer 1 | 24 | 24 | 24 | 24 | 24 | 24 | 24 |
| | | Copolymer 2 | | | | | | | |
| | | A2 PPE1 | 36 | | | 36 | 36 | 36 | 36 |
| | | PPE2 | | 36 | | | | | |
| | | PPE3 | | | 36 | | | | |
| | | A3 Unsaturated compound 1 | 10 | 10 | 10 | 10 | 10 | 10 | 10 |
| | | Unsaturated compound 2 | | | | | | | |
| | | Unsaturated compound 3 | | | | | | | |
| | | Unsaturated compound 4 | | | | | | | |
| | | Unsaturated compound 5 | | | | | | | |
| | | Unsaturated compound 6 | | | | | | | |
| | B | Thermal radical polymerization initiator 1 | 7.35 | 7.35 | 7.35 | 7.35 | 7.35 | 7.35 | |
| | | Thermal radical polymerization initiator 2 | | | | | | | 7.35 |
| | | Thermal radical polymerization initiator 3 | | | | | | | |
| | | Thermal radical polymerization initiator 4 | | | | | | | |
| | C | Organic radical compound 1 | 1.40 | 1.40 | 1.40 | 1.40 | 1.40 | 1.40 | 1.40 |
| | | Organic radical compound 2 | | | | | | | |
| | | Organic radical compound 3 | | | | | | | |
| | D | Metal deactivator | 0.70 | 0.70 | 0.70 | 0.70 | 0.70 | | |
| | E | Elastomer 1 | 30 | 30 | 30 | | | 30 | 30 |
| | | Elastomer 2 | | | | 30 | | | |
| | | Elastomer 3 | | | | | 30 | | |
| | F | Inorganic filler | 250 | 250 | 250 | 250 | 250 | 250 | 250 |
| | G | Flame retardant | 50 | 50 | 50 | 50 | 50 | 50 | 50 |
| | Others | Antioxidant | 1.05 | 1.05 | 1.05 | 1.05 | 1.05 | 1.05 | 1.05 |
| Evaluation | | Temperature (° C.) at which lowest melt viscosity was exhibited | 182 | 180 | 185 | 185 | 179 | 170 | 179 |
| | | Relative dielectric constant | 2.77 | 2.75 | 2.8 | 2.78 | 2.82 | 2.76 | 2.79 |
| | | Dielectric loss tangent | 0.0017 | 0.0016 | 0.0017 | 0.0015 | 0.0018 | 0.0015 | 0.0014 |
| | | Δ Df | 0.0009 | 0.0005 | 0.0005 | 0.001 | 0.0011 | 0.0015 | 0.0015 |
| | | Coefficient of linear expansion (α1) (ppm/° C.) | 32 | 37 | 39 | 38 | 33 | 30 | 34 |
| | | Coefficient of linear expansion (average in 30-250° C. (ppm/° C.) | 34 | 45 | 48 | 45 | 38 | 27 | 30 |
| | | Glass transition temperature (° C.) | 241 | 231 | 224 | 221 | 239 | 243 | 250 |
| | | Flame retardancy | V-0 | V-0 | V-0 | V-0 | V-0 | V-0 | V-0 |

TABLE 2

| | | | Examples | | | | | | |
|---|---|---|---|---|---|---|---|---|---|
| | | | 8 | 9 | 10 | 11 | 12 | 13 | 14 |
| Composition (parts by mass) | A | A1 Copolymer 1 | 24 | 24 | | | | | |
| | | Copolymer 2 | | | 24 | 24 | 24 | 24 | 24 |
| | | A2 PPE1 | 36 | 36 | 36 | 36 | 36 | 36 | 36 |
| | | PPE2 | | | | | | | |
| | | PPE3 | | | | | | | |
| | | A3 Unsaturated compound 1 | 10 | 10 | 10 | 10 | 10 | 10 | 10 |
| | | Unsaturated compound 2 | | | | | | | |
| | | Unsaturated compound 3 | | | | | | | |
| | | Unsaturated compound 4 | | | | | | | |
| | | Unsaturated compound 5 | | | | | | | |
| | | Unsaturated compound 6 | | | | | | | |
| | B | Thermal radical polymerization initiator 1 | | | | | | | |
| | | Thermal radical polymerization initiator 2 | | | 7.35 | 7.35 | 7.35 | 1.58 | 1.58 |
| | | Thermal radical polymerization initiator 3 | 7.35 | | | | | | |
| | | Thermal radical polymerization initiator 4 | | 7.35 | | | | | |
| | C | Organic radical compound 1 | 1.40 | 1.40 | 1.40 | 1.40 | 2.80 | 1,75 | 0.49 |
| | | Organic radical compound 2 | | | | | | | |
| | | Organic radical compound 3 | | | | | | | |

TABLE 2-continued

|  |  |  | Examples | | | | | | |
|---|---|---|---|---|---|---|---|---|---|
|  |  |  | 8 | 9 | 10 | 11 | 12 | 13 | 14 |
|  | D | Metal deactivator |  |  | 0.70 |  | 0.70 | 0.70 | 0.70 |
|  | E | Elastomer 1 | 30 | 30 | 30 | 30 | 30 | 30 | 30 |
|  |  | Elastomer 2 |  |  |  |  |  |  |  |
|  |  | Elastomer 3 |  |  |  |  |  |  |  |
|  | F | Inorganic filler | 250 | 250 | 250 | 250 | 250 | 250 | 250 |
|  | G | Flame retardant | 50 | 50 | 50 | 50 | 50 | 50 | 50 |
|  | Others | Antioxidant | 1.05 | 1.05 | 1.05 | 1.05 | 1.05 | 1.05 | 1.05 |
| Evaluation |  | Temperature (° C.) at which lowest melt viscosity was exhibited | 163 | 160 | 181 | 181 | 195 | 172 | 175 |
|  |  | Relative dielectric constant | 2,76 | 2.81 | 2.81 | 2.8 | 2.84 | 2.8 | 2.79 |
|  |  | Dielectric loss tangent | 0.0018 | 0.0020 | 0.0015 | 0.0015 | 0.0019 | 0.0014 | 0.0015 |
|  |  | Δ Df | 0.0018 | 0.0032 | 0.0012 | 0.0019 | 0.0014 | 0.0013 | 0.0012 |
|  |  | Coefficient of linear expansion (α1) (ppm/° C.) | 33 | 25 | 30 | 28 | 17 | 22 | 21 |
|  |  | Coefficient of linear expansion (average in 30-250° C. (ppm/° C.) | 29 | 30 | 40 | 37 | 36 | 41 | 31 |
|  |  | Glass transition temperature (° C.) | 245 | 253 | 230 | 231 | 242 | 240 | 242 |
|  |  | Flame retardancy | V-0 | V-0 | V-0 | V-0 | V-0 | V-0 | V-0 |

TABLE 3

|  |  |  | Examples | | | | | | |
|---|---|---|---|---|---|---|---|---|---|
|  |  |  | 15 | 16 | 17 | 18 | 19 | 20 | 21 |
| Composition (parts by mass) | A | A1 Copolymer 1 |  |  |  |  |  | 24 | 24 |
|  |  | Copolymer 2 | 24 | 24 | 24 | 24 | 24 |  |  |
|  |  | A2 PPE1 | 36 | 36 | 36 | 36 | 36 | 36 | 36 |
|  |  | PPE2 |  |  |  |  |  |  |  |
|  |  | PPE3 |  |  |  |  |  |  |  |
|  |  | A3 Unsaturated compound 1 | 10 | 10 | 10 | 10 | 10 |  |  |
|  |  | Unsaturated compound 2 |  |  |  |  |  | 10 |  |
|  |  | Unsaturated compound 3 |  |  |  |  |  |  | 10 |
|  |  | Unsaturated compound 4 |  |  |  |  |  |  |  |
|  |  | Unsaturated compound 5 |  |  |  |  |  |  |  |
|  |  | Unsaturated compound 6 |  |  |  |  |  |  |  |
|  | B | Thermal radical polymerization initiator 1 |  |  |  |  |  |  |  |
|  |  | Thermal radical polymerization initiator 2 | 1.58 | 7.35 | 7.35 | 4.73 | 4.73 | 7.35 | 7.35 |
|  |  | Thermal radical polymerization initiator 3 |  |  |  |  |  |  |  |
|  |  | Thermal radical polymerization initiator 4 |  |  |  |  |  |  |  |
|  | C | Organic radical compound 1 | 0.10 |  |  | 0.49 | 1.44 | 1.40 | 1.40 |
|  |  | Organic radical compound 2 |  | 1.40 |  |  |  |  |  |
|  |  | Organic radical compound 3 |  |  | 1.40 |  |  |  |  |
|  | D | Metal deactivator | 0.70 | 0.70 | 0.70 | 0.70 | 0.70 | 0.70 | 0.70 |
|  | E | Elastomer 1 | 30 | 30 | 30 | 30 | 30 | 30 | 30 |
|  |  | Elastomer 2 |  |  |  |  |  |  |  |
|  |  | Elastomer 3 |  |  |  |  |  |  |  |
|  | F | Inorganic filler | 250 | 250 | 250 | 250 | 250 | 250 | 250 |
|  | G | Flame retardant | 50 | 50 | 50 | 50 | 50 | 50 | 50 |
|  | Others | Antioxidant | 1.05 | 1.05 | 1.05 | 1.05 | 1.05 | 1.05 | 1.05 |
| Evaluation |  | Temperature (° C.) at which lowest melt viscosity was exhibited | 160 | 183 | 175 | 171 | 176 | 187 | 185 |
|  |  | Relative dielectric constant | 2.76 | 2.82 | 2.81 | 2.79 | 2.8 | 2.83 | 2.74 |
|  |  | Dielectric loss tangent | 0.0012 | 0.0019 | 0.0018 | 0.0016 | 0.0015 | 0.0019 | 0.0013 |
|  |  | Δ Df | 0.0012 | 0.0011 | 0.0014 | 0.0013 | 0.0011 | 0.0013 | 0.0014 |
|  |  | Coefficient of linear expansion (α1) (ppm/° C.) | 25 | 31 | 30 | 26 | 21 | 39 | 24 |
|  |  | Coefficient of linear expansion (average in 30-250° C. (ppm/° C.) | 43 | 42 | 37 | 39 | 32 | 47 | 35 |
|  |  | Glass transition temperature (° C.) | 230 | 232 | 242 | 244 | 244 | 231 | 240 |
|  |  | Flame retardancy | V-0 | V-0 | V-0 | V-0 | V-0 | V-0 | V-0 |

TABLE 4

|  |  |  | Examples | | | | Comparative Examples | | | |
| --- | --- | --- | --- | --- | --- | --- | --- | --- | --- | --- |
|  |  |  | 22 | 23 | 24 | 25 | 1 | 2 | 3 | 4 |
| Composition (parts by mass) | A | A1 Copolymer 1 | 24 | 24 | 24 |  | 24 | 24 | 24 | 24 |
|  |  | Copolymer 2 |  |  |  |  |  |  |  |  |
|  |  | A2 PPE1 | 36 | 36 | 36 | 36 | 36 | 36 | 36 | 36 |
|  |  | PPE2 |  |  |  |  |  |  |  |  |
|  |  | PPE3 |  |  |  |  |  |  |  |  |
|  |  | A3 Unsaturated compound 1 |  |  | 10 |  | 10 | 10 | 10 | 10 |
|  |  | Unsaturated compound 2 |  |  |  |  |  |  |  |  |
|  |  | Unsaturated compound 3 |  |  |  |  |  |  |  |  |
|  |  | Unsaturated compound 4 | 10 |  |  |  |  |  |  |  |
|  |  | Unsaturated compound 5 |  | 10 |  |  |  |  |  |  |
|  |  | Unsaturated compound 6 |  |  |  | 34 |  |  |  |  |
|  | B | Thermal radical polymerization initiator 1 |  |  | 7.35 | 7.35 | 7.35 |  |  |  |
|  |  | Thermal radical polymerization initiator 2 | 7.35 | 7.35 |  |  |  | 7.35 |  |  |
|  |  | Thermal radical polymerization initiator 3 |  |  |  |  |  |  | 7.35 |  |
|  |  | Thermal radical polymerization initiator 4 |  |  |  |  |  |  |  | 7.35 |
|  | C | Organic radical compound 1 | 1.40 | 1.40 | 1.40 | 1.40 |  |  |  |  |
|  |  | Organic radical compound 2 |  |  |  |  |  |  |  |  |
|  |  | Organic radical compound 3 |  |  |  |  |  |  |  |  |
|  | D | Metal deactivator | 0.70 | 0.70 | 0.70 | 0.70 |  |  |  |  |
|  | E | Elastomer 1 | 30 | 30 | 30 | 30 | 30 | 30 | 30 | 30 |
|  |  | Elastomer 2 |  |  |  |  |  |  |  |  |
|  |  | Elastomer 3 |  |  |  |  |  |  |  |  |
|  | F | Inorganic filler | 250 | 250 | 250 | 250 | 250 | 250 | 250 | 250 |
|  | G | Flame retardant | 50 | 50 | 50 | 50 | 50 | 50 | 50 | 50 |
|  | Others | Antioxidant | 1.05 | 1.05 | 1.05 | 1.05 | 1.05 | 1.05 | 1.05 | 1.05 |
| Evaluation |  | Temperature (° C.) at which lowest melt viscosity was exhibited | 192 | 183 | 182 | 180 | 127 | 138 | 110 | 129 |
|  |  | Relative dielectric constant | 2.76 | 2.78 | 2.77 | 2.87 | 2.77 | 2.78 | 2.79 | 2.81 |
|  |  | Dielectric loss tangent | 0.0014 | 0.0019 | 0.0017 | 0.0034 | 0.00145 | 0.00142 | 0.00178 | 0.0025 |
|  |  | Δ Df | 0.0014 | 0.0015 | 0.0009 | 0.001 | 0.0016 | 0.0015 | 0.0017 | 0.0043 |
|  |  | Coefficient of linear expansion (α1) (ppm/° C.) | 34 | 32 | 32 | 37 | 28 | 37 | 42 | 35 |
|  |  | Coefficient of linear expansion (average in 30-250° C.) (ppm/° C.) | 46 | 45 | 34 | 47 | 56 | 56 | 63 | 53 |
|  |  | Glass transition temperature (° C.) | 237 | 236 | 241 | 217 | 212 | 208 | 210 | 218 |
|  |  | Flame retardancy | V-0 | V-0 | V-0 | V-0 | Non | Non | Non | Non |

As can be seen from these results, in Examples 1 to 24 containing the radical polymerizable unsaturated compound (A) and the organic radical compound (C), the temperature at which the resin sheet exhibited the lowest melt viscosity was higher than in any of Comparative Examples 1 to 4. This facilitates maintaining a low melt viscosity when the resin sheet is heated. In addition, in Examples 1 to 24, a low relative dielectric constant, a low dielectric loss tangent, high thermal stability of a high dielectric loss tangent, a high glass transition temperature, and high flame retardancy were achieved.

The invention claimed is:

1. A thermosetting resin composition comprising:
a radical polymerizable unsaturated compound (A);
an organic radical compound (C), and
a styrene-based elastomer (E);
the radical polymerizable unsaturated compound (A) containing:
a copolymer (A1) having a structural unit derived from mono-olefin and a structural unit derived from diene; and
a terminal modified polyphenylene ether compound (A2), and
a content of the elastomer (E) falling within the range from 5 parts by mass to 100 parts by mass with respect to 100 parts by mass in total of the copolymer (A1) and the compound (A2).

2. The thermosetting resin composition of claim 1, further containing a thermal radical polymerization initiator (B).

3. The thermosetting resin composition of claim 2, wherein
the thermal radical polymerization initiator (B) contains at least one compound selected from the group consisting of: a t-amyl peroxide-based polymerization initiator; and a t-hexyl peroxide-based polymerization initiator.

4. The thermosetting resin composition of claim 1, wherein
the organic radical compound (C) contains an organic nitroxide radical compound (C1).

5. The thermosetting resin composition of claim 1, further containing a metal deactivator (D).

6. The thermosetting resin composition of claim 1, further containing an inorganic filler (F).

7. The thermosetting resin composition of claim 6, wherein
the inorganic filler (F) contains silica subjected to surface treatment with a polymerizable organic compound.

8. The thermosetting resin composition of claim 1, further containing a flame retardant (G).

9. A resin sheet comprising a dried product or semi-cured product of the thermosetting resin composition of claim 1.

10. A laminate comprising
an insulating layer and
a sheet of metal foil,
the insulating layer containing a cured product of the thermosetting resin composition of claim 1.

11. A printed wiring board comprising an insulating layer and conductor wiring,
the insulating layer containing a cured product of the thermosetting resin composition of claim 1.

* * * * *